(12) United States Patent
Sim et al.

(10) Patent No.: US 10,748,977 B2
(45) Date of Patent: Aug. 18, 2020

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-Do (KR)

(72) Inventors: Suyeon Sim, Yongin-si (KR); Kwangsuk Kim, Yongin-si (KR); Sangho Park, Yongin-si (KR); Seunghwan Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/196,811

(22) Filed: Jun. 29, 2016

(65) Prior Publication Data

US 2017/0141169 A1 May 18, 2017

(30) Foreign Application Priority Data

Nov. 13, 2015 (KR) ........................ 10-2015-0159698

(51) Int. Cl.
*H01L 27/32* (2006.01)
*H01L 51/56* (2006.01)
*H01L 27/12* (2006.01)

(52) U.S. Cl.
CPC ...... *H01L 27/3258* (2013.01); *H01L 27/3216* (2013.01); *H01L 27/3246* (2013.01); *H01L 27/3248* (2013.01); *H01L 27/3262* (2013.01); *H01L 27/3265* (2013.01); *H01L 27/3276* (2013.01); *H01L 51/56* (2013.01); *H01L 27/124* (2013.01); *H01L 27/1248* (2013.01); *H01L 27/1255* (2013.01); *H01L 27/1259* (2013.01); *H01L 2227/323* (2013.01)

(58) Field of Classification Search
CPC ........................................................ H01L 51/56
See application file for complete search history.

(56) References Cited

U.S. PATENT DOCUMENTS

| | | | |
|---|---|---|---|
| 5,905,548 A * | 5/1999 | Shimada | H01L 27/12 257/E27.111 |
| 8,164,099 B2 | 4/2012 | Yamazaki et al. | |
| 9,088,003 B2 | 7/2015 | Gupta et al. | |
| 2005/0269946 A1* | 12/2005 | Jeong | H01L 27/3258 313/504 |

(Continued)

FOREIGN PATENT DOCUMENTS

| | | |
|---|---|---|
| CN | 101641794 | 6/2012 |
| CN | 104241550 | 12/2014 |

(Continued)

OTHER PUBLICATIONS

Office Action dated Oct. 30, 2019 for Taiwanese Patent Application No. 105125920.

*Primary Examiner* — Vongsavanh Sengdara
(74) *Attorney, Agent, or Firm* — F. Chau & Associates, LLC

(57) ABSTRACT

An organic light-emitting display apparatus is provided as follows. A thin film transistor is disposed on a substrate. A first insulating layer covers the thin film transistor. The first insulating layer includes a barrier wall and a flat portion. The barrier wall protrudes from the flat portion. A pixel electrode is disposed on the flat portion surrounded by the barrier wall. The pixel electrode is electrically connected to the thin film transistor. A pixel defining layer is disposed on the pixel electrode and partially exposes the pixel electrode.

20 Claims, 24 Drawing Sheets

(56) References Cited

U.S. PATENT DOCUMENTS

| | | | | |
|---|---|---|---|---|
| 2010/0045173 | A1* | 2/2010 | Kwon | H01L 27/3246 313/504 |
| 2010/0073268 | A1 | 3/2010 | Matsunaga et al. | |
| 2011/0193067 | A1* | 8/2011 | Lee | H01L 51/5256 257/40 |
| 2011/0198596 | A1 | 8/2011 | Park | |
| 2012/0007057 | A1* | 1/2012 | Choi | H01L 27/3246 257/40 |
| 2012/0049169 | A1 | 3/2012 | Kim | |
| 2012/0097992 | A1* | 4/2012 | Jeong | H01L 51/0011 257/88 |
| 2012/0169229 | A1* | 7/2012 | You | H01L 27/3244 315/51 |
| 2014/0027729 | A1* | 1/2014 | So | H01L 51/5056 257/40 |
| 2014/0110680 | A1* | 4/2014 | Choe | H01L 27/3244 257/40 |
| 2014/0284563 | A1* | 9/2014 | Baek | H01L 51/5203 257/40 |
| 2015/0102316 | A1* | 4/2015 | Park | H01L 27/3258 257/40 |
| 2015/0137090 | A1* | 5/2015 | Lee | H01L 27/326 257/40 |
| 2015/0179708 | A1* | 6/2015 | Jeon | H01L 27/326 257/40 |
| 2016/0043348 | A1* | 2/2016 | Zhang | H01L 51/5256 257/40 |

FOREIGN PATENT DOCUMENTS

| | | |
|---|---|---|
| KR | 10-2011-0094460 | 8/2011 |
| KR | 10-2012-0073704 | 7/2012 |
| KR | 10-2014-0085326 | 7/2014 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2015-0159698, filed on Nov. 13, 2015, in the Korean Intellectual Property Office, the disclosure of which is incorporated by reference herein in its entirety.

TECHNICAL FIELD

The present invention relates to an organic light-emitting display apparatus and a method of manufacturing the organic light-emitting display apparatus.

DISCUSSION OF RELATED ART

Organic light-emitting display apparatuses include an organic light emitting diode that includes a hole injection electrode and an electron injection electrode, and an organic emission layer between the hole injection electrode and the electron injection electrode. In addition, an organic light-emitting display apparatuses are self-emissive. In the organic emission layer, holes injected through the hole injection electrode and electrons injected through the electron injection electrode combine with each other to generate excitons that fall to a ground state from an excited state to generate light.

The organic light-emitting display apparatuses do not need a light source, and thus the organic light-emitting display apparatuses may operate with a low voltage and may be formed to be lightweight and thin. In addition, since the organic light-emitting display apparatuses are excellent in a viewing angle, contrast, and response speed, fields to which the organic light-emitting display apparatuses are applied have been recently expanded from personal portable devices such as MP3 players and mobile phones, to televisions (Ns).

SUMMARY

According to an exemplary embodiment of the present invention, an organic light-emitting display apparatus is provided as follows. A thin film transistor is disposed on a substrate. A first insulating layer covers the thin film transistor. The first insulating layer includes a barrier wall and a flat portion. The barrier wall protrudes from the flat portion. A pixel electrode is disposed on the flat portion and a first side surface of the barrier wall. The pixel electrode is electrically connected to the thin film transistor. A pixel defining layer is disposed on the pixel electrode and partially exposes the pixel electrode.

According to an exemplary embodiment of the present inventive concept, a method of manufacturing an organic light-emitting display apparatus is provided as follows. A thin film transistor is formed on a substrate. A first insulating layer is formed on the thin film transistor and the substrate. The first insulating layer covers the thin film transistor and comprises a flat portion and a barrier wall protruding from the flat portion. A pixel electrode is formed on the flat portion and a first side surface of the barrier wall. The pixel electrode is electrically connected to the thin film transistor. A pixel defining layer is formed on the pixel electrode. The pixel defining layer partially exposes the pixel electrode.

According to an exemplary embodiment of the present invention, an organic light-emitting display apparatus is provided as follows. A thin film transistor is disposed on a substrate. A first insulating layer covers the thin film transistor. The first insulating layer includes a barrier wall and a flat portion. The barrier wall is ring-shaped to surround the flat portion. A pixel electrode is disposed on the flat portion and within the barrier wall. The pixel electrode is spaced apart from the barrier wall. The pixel electrode is electrically connected to the thin film transistor. A pixel defining layer is disposed on the pixel electrode and partially exposes the pixel electrode.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
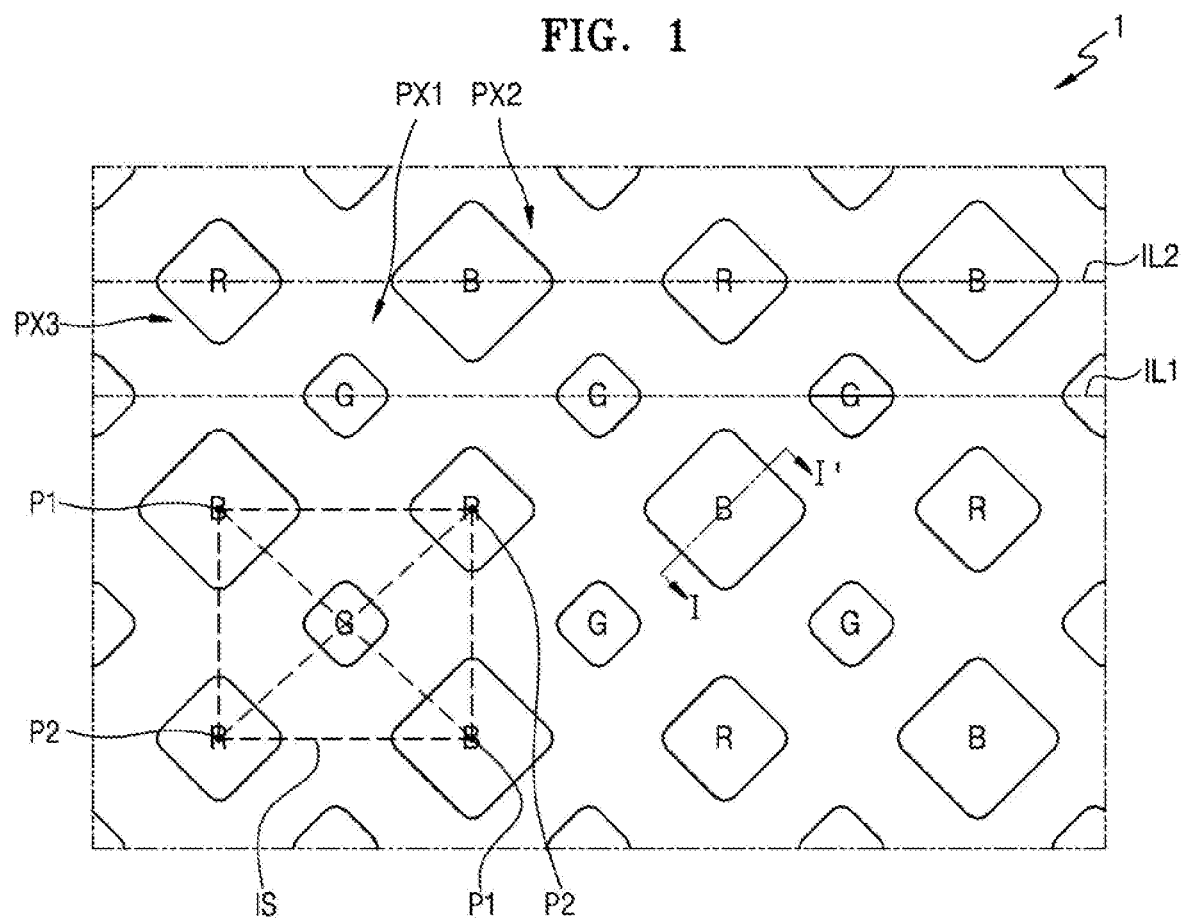
FIG. 1 is a partial plan view of an organic light-emitting display apparatus according to an embodiment.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Sizes of components in the drawings may be exaggerated for convenience of explanation. In other words, since sizes and thicknesses of components in the drawings are arbitrarily illustrated for convenience of explanation, the following embodiments are not limited thereto.

FIG. 1 is a partial plan view of an organic light-emitting display apparatus 1 according to an exemplary embodiment of the present inventive concept.

Referring to FIG. 1, a plurality of pixels may be arranged on a display area of the organic light-emitting display apparatus 1. For example, the organic light-emitting display apparatus 1 may include a plurality of first pixels PX1, a plurality of second pixels PX2, and a plurality of third pixels PX3. The plurality of first pixels PX1, the plurality of second pixels PX2, and the plurality of third pixels PX3 may be repeatedly arranged in a column direction and a row direction according to a predetermined pattern.

Each of the first pixels PX1 may have a less area than those of the second pixels PX2 and the third pixels PX3 neighboring around the first pixel PX1. The first pixel PX1 may be a green pixel G emitting green light. The plurality of first pixels PX1 are spaced apart from each other and arranged on a virtual first straight line IL1. The first pixel PX1 may have a polygonal shape such as a quadrangular shape, an octagonal shape, a circular shape, an oval shape, and the polygonal shape may have round vertexes.

The first pixels PX1 are located at the centers of virtual quadrangles IS. The second pixels PX2 are located on a pair of first vertexes P1 of the virtual quadrangles IS. The first vertexes P1 face each other. The third pixels PX3 are located on a pair of second vertexes P2 of the virtual quadrangles IS. The second vertexes P2 face each other in the virtual quadrangle IS. The virtual quadrangles IS may be a square.

The second pixels PX2 are spaced apart from the first pixels PX1 and the third pixels PX3, and each has a center point at the first vertexes P1 of the virtual quadrangles IS. Each second pixel PX2 may have a greater area than that of the neighboring first pixel PX1. The second pixel PX2 may be a blue pixel B emitting blue light. The second pixel PX2 may have a polygonal shape such as a quadrangular shape and an octagonal shape, a circular shape, and an oval shape, and the polygonal shape may include round vertexes.

The third pixels PX3 are spaced apart from the first pixels PX1 and the second pixels PX2, and each has a center point at the second vertexes P2 that are next to the first vertexes P1 in the virtual quadrangles IS. Each third pixel PX3 may have a greater area than that of the neighboring first pixel PX1. In addition, the third pixel PX3 may have an area different from that of the second pixel PX2. For example, the third pixel PX3 may have a greater area than that of the second pixel PX2. In an exemplary embodiment, the third pixel PX3 may have the same area as that of the second pixel PX2. The third pixel PX3 may be a red pixel R emitting red light. The third pixel PX3 may have a polygonal shape such as a quadrangular shape and an octagonal shape, a circular shape, or an oval shape, and the polygonal shape may have round vertexes.

Each of the third pixels PX3 and each of the second pixels PX2 are alternately arranged on a virtual second straight line IL2, and accordingly, the plurality of second pixels PX2 having the center points thereof at the first apexes P1 and the plurality of third pixels PX3 having the center points thereof at the second apexes P2 surround the plurality of first pixels PX1.

Since the plurality of second pixels PX2 and the plurality of third pixels PX3 are arranged to surround the plurality of first pixels PX1, aperture rates of the first, second, and third pixels PX1, PX2, and PX3 may be increased. This may apply as a factor for reducing time and price taken to manufacture an organic light-emitting display apparatus and for improving the quality of images displayed by the organic light-emitting display apparatus.

In addition, according to the pixel arrangement structure of the embodiment, pixels emitting light of the same color are spaced apart largely from each other, thereby improving the reliability of deposition. In addition, pixels emitting light of different colors, that is, red pixels, green pixels, and blue pixels, are spaced apart narrowly from each other, thereby improving aperture ratios.

In addition, according to the pixel arrangement structure in the organic light-emitting display apparatus 1 of the embodiment, the first pixels PX1, the second pixels PX2, and the third pixels PX3 respectively emit green light, blue light, and red light, but one or more embodiments are not limited thereto. That is, the first pixels PX1, the second pixels PX2, and the third pixels PX3 may emit light of different colors from green, blue, and red. For example, one or more of the second and third pixels PX2 and PX3 may emit white light.

Figure 2:
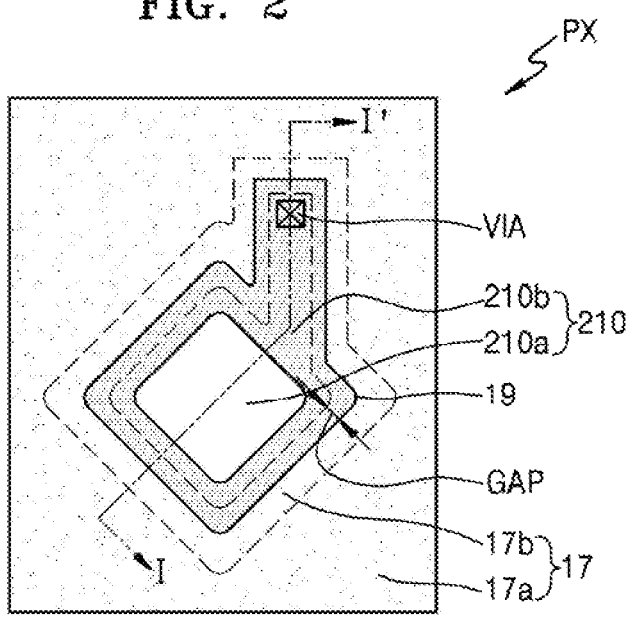
FIG. 2 is a plan view of the organic light-emitting display apparatus, taken along a line I-I' of FIG. 1.
Figure 3:
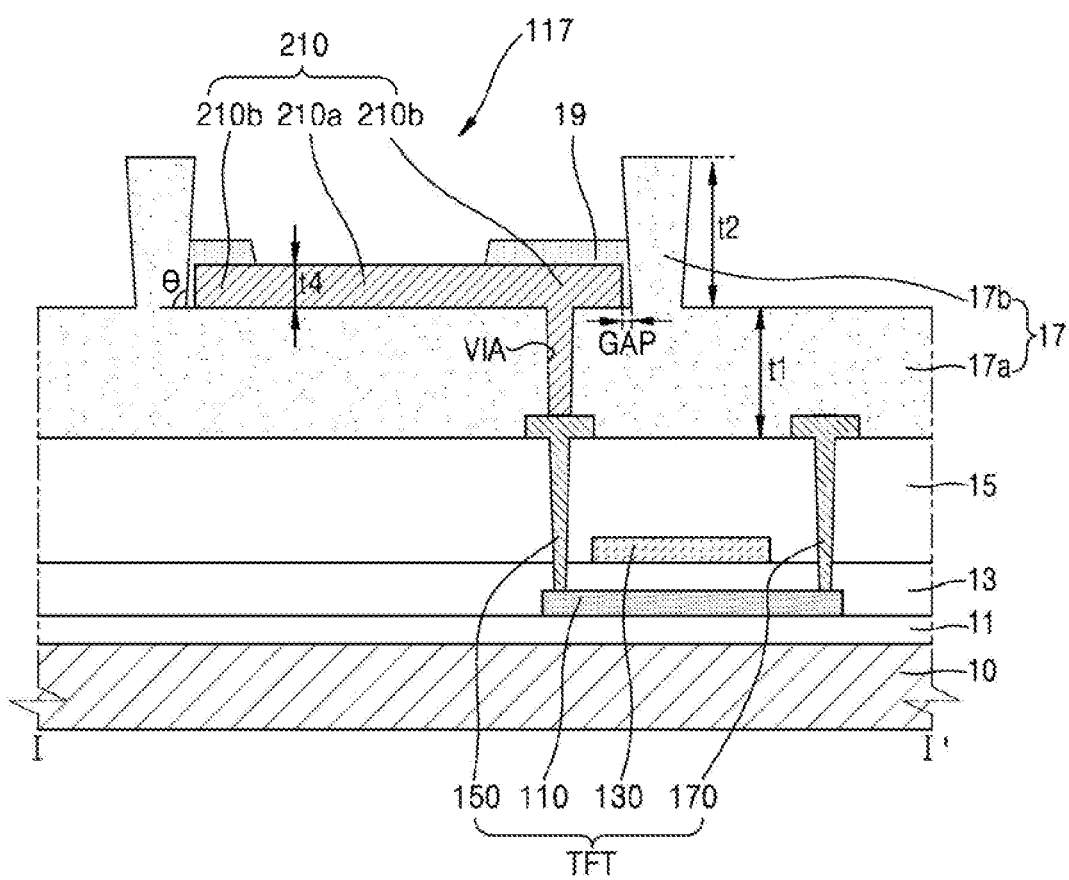
FIG. 3 is a cross-sectional view of the organic light-emitting display apparatus, taken along a line I-I' of FIG. 1.

FIG. 2 is a partial plan view of the organic light-emitting display apparatus 1, taken along line I-I' of FIG. 1. FIG. 3 is a partially cross-sectional view of the organic light-emitting display apparatus 1, taken along line I-I' of FIG. 1.

Views of the second pixel PX2 are taken along the line I-I' of FIG. 1. The plan view and the cross-sectional view of the second pixel PX2 may be substantially the same as those of the first and third pixels PX1 and PX3, and thus a pixel PX will be representatively described for convenience of description hereinafter.

Referring to FIGS. 2 and 3, the organic light-emitting display apparatus 1 includes a thin film transistor TFT disposed on a display area of a substrate 10, a via insulating layer 17 covering the thin film transistor TFT, a pixel electrode 210 disposed on the via insulating layer 17 and electrically connected to the thin film transistor TFT, and a pixel defining layer 19 partially covering the pixel electrode 210. The via insulating layer 17 may be referred to as a first insulating layer 17.

A pixel PX may include an organic light-emitting diode (OLED) and a driving circuit for driving the OLED. The OLED may include the pixel electrode 210, an opposite electrode facing the pixel electrode 210, and an organic emission layer disposed between the pixel electrode 210 and the opposite electrode. The driving circuit may include at least one thin film transistor TFT and at least one capacitor. With reference to FIG. 3, only the pixel electrode 210 of the OLED and the thin film transistor TFT included in the driving circuit are described for convenience of description.

The thin film transistor TFT may include an active layer 110 disposed on a buffer layer 11, a gate electrode 130 insulated from the active layer 110 and at least partially disposed over the active layer 110, a source electrode 170, and a drain electrode 150 electrically connected to a pixel electrode 210. A gate insulating layer 13 is disposed between the active layer 110 and the gate electrode 130, and an interlayer insulating layer 15 may be disposed between the gate electrode 130 and the source and drain electrodes 170 and 150. The source electrode 170 and the drain electrode 150 may be respectively connected to a source region and a drain region of the active layer 110.

The thin film transistor TFT according to the embodiment is a top gate type in which the gate electrode 130 is disposed over the active layer 110, but the present invention is not limited thereto. For example, the thin film transistor TFT may be a bottom gate type in which the gate electrode 130 is disposed under the active layer 110.

The buffer layer 11, the gate insulating layer 13, and the interlayer insulating layer 15 may extend to a part of a non-display area around the display area, as well as the display area. According to an exemplary embodiment, the buffer layer 11, the gate insulating layer 13, and the interlayer insulating layer 15 may be disposed on the entire substrate 10, except an outermost region of the substrate 10.

The via insulating layer 17 covering the thin film transistor TFT may be disposed over the thin film transistor TFT. The via insulating layer 17 may provide a planarized upper surface to a subsequent process. The via insulating layer 17 may have a single-layered structure or a multi-layered structure including an organic material. However, the present invention is not limited thereto. For example, the via insulating layer 17 may have a composite stack structure including an inorganic insulating layer and an organic insulating layer.

The via insulating layer 17 includes a via hole VIA, a flat portion 17a having a first thickness t1, and a barrier wall 17b protruding from the flat portion 17a to a second thickness t2. The shape of the barrier wall 17b of the via insulating layer 17 may be similar to that of the pixel electrode 210, in a plan view. A thickness of the barrier wall 17b of the via insulating layer 17 is greater than that of the pixel defining layer 19. In an exemplary embodiment, the thickness of the barrier wall 17b may be sufficient to prevent damage to the pixel electrode 210 due to a mask during a deposition process using a fine metal mask (FMM) for forming an organic emission layer in each of the pixels emitting light of different colors, and thus, the reliability of the deposition process may be increased. For example, the second thickness t2 of the barrier wall 17b may be about 3 µm to about 4 µm.

An upper surface of the flat portion 17a may be in parallel with the surfaces of the substrate 10.

The barrier wall 17b may have an inverse-tapered shape, a width of which gradually increases away from the substrate 10 or the flat portion 17a. For example, the width of the barrier wall 17b increases upwardly and gradually. However, the present invention is not limited thereto. For example, the barrier wall 17b may have a constant width. That is, an angle θ between an inner side surface of the barrier wall 17b and a surface of the substrate 10, that is, an upper surface of the flat portion 17a, may be 90° or greater. The barrier wall 17b surrounds the pixel electrode 210 along edges of the pixel electrode 210. In an exemplary embodiment, the pixel electrode 210 may be disposed on a bottom surface of a trench 117 formed in the via insulating layer 17 by the barrier wall 17b. The barrier wall 17b surrounds the trench 117. A side surface of the trench 117 is defined by the barrier wall 17b, and the trench 117 may have an inverse-tapered shape having an internal width that is reduced from a bottom portion upwards.

The pixel electrode 210 may be electrically connected to the thin film transistor TFT via the via hole VIA located in the trench 117. The via hole VIA penetrates the flat portion 17a to expose the drain electrode 150. The pixel electrode 210 is confined within the trench 117, and thus the pixel electrode 210 is of an independent island type disposed on the via insulating layer 17. The pixel electrode 210 according to the embodiment is electrically connected to the drain electrode 150, but the present invention is not limited thereto. For example, the pixel electrode 210 may be electrically connected to the source electrode 170.

The pixel electrode 210 includes a first region 210a on which an organic emission layer is disposed, and a second region 210b at the periphery of the first region 210a.

The first region 210a of the pixel electrode 210 may be formed as a polygon such as a quadrangle and an octagon, a circle, or an oval. The organic emission layer (not shown) is formed on the first region 210a of the pixel electrode 210, and an opposite electrode (not shown) is formed on the organic emission layer. The shape of the first region 210a in the pixel electrode 210 may determine the shape of the pixel PX.

The second region 210b of the pixel electrode 210 is covered by the pixel defining layer 19, and a part of the second region 210b may be located on the via hole VIA. A direction in which the second region 210b extends from the first region 210a may vary depending on location of the via hole VIA. In the plan view of FIG. 2, the second region 210b extends from the first region 210a upward straightly, and the via hole VIA is located on the slightly-upward portion of the second region 210b. However, the present invention is not limited thereto. For example, the direction in which the second region 210b extends may vary depending on the location of the via hole VIA in each of the pixels PX.

The pixel electrode 210 is on the flat portion 17a surrounded by the barrier wall 17b. The pixel electrode 210 is spaced apart from the barrier wall 17b by a predetermined gap GAP. A size of the gap GAP between the pixel electrode 210 and the barrier wall 17b may vary depending on the angle θ of the barrier wall 17b.

The pixel defining layer 19 may be disposed in the gap GAP between the pixel electrode 210 and the barrier wall 17b. The pixel defining layer 19 fills the gap GAP between the pixel electrode 210 and the barrier wall 17b, and covers the second region 210b of the pixel electrode 210. The second thickness t2 of the barrier wall 17b is greater than a fourth thickness t4 of the pixel defining layer 19.

FIGS. 4A to 4I are cross-sectional views showing manufacturing the organic light-emitting display apparatus 1 of FIG. 1.

Figure 4A:
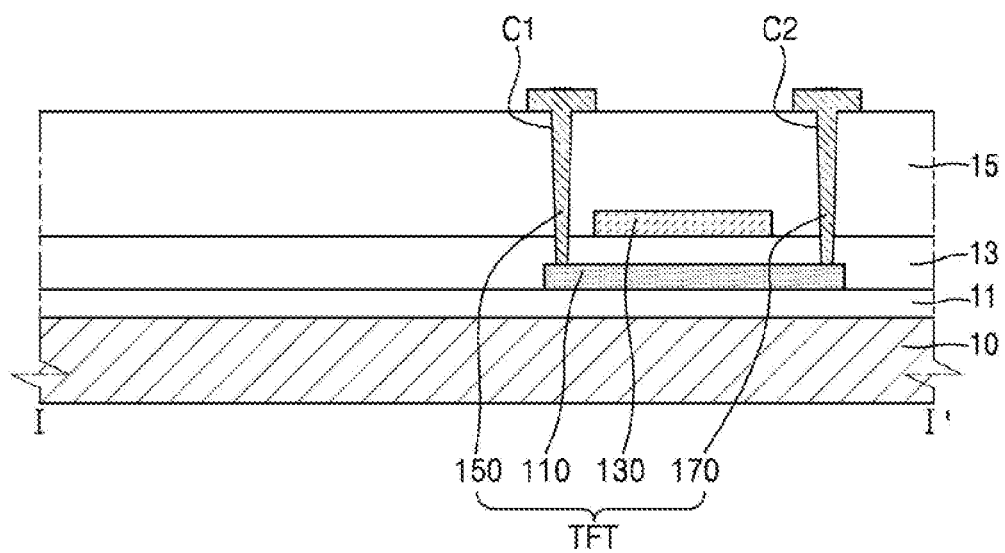
FIGS. 4A to 4I are cross-sectional views showing processes of manufacturing the organic light-emitting display apparatus of FIG. 1.

Referring to FIG. 4A, the thin film transistor TFT may be disposed on the substrate 10.

After forming the buffer layer 11 on the substrate 10, a semiconductor layer including a semiconductor material is formed on the buffer layer 11, and is patterned to form the active layer 110.

The substrate 10 may include various materials, for example, glass, metal, and plastic. According to the embodiment, the substrate 10 may include a flexible substrate. Here, the flexible substrate denotes a substrate that may be curved, bent, folded, or rolled up. The flexible substrate may include ultra-thin glass, metal, or plastic. For example, when the substrate 10 includes a plastic material, the substrate 10 may include polyimide (PI), but the present invention is not limited thereto.

The buffer layer 11 prevents infiltration of impurity elements and planarizes a surface of the substrate 10. The buffer layer 11 may be disposed on the substrate 10. The buffer layer 11 may have a single-layered structure or a multi-layered structure including an inorganic material such as silicon nitride (SiNx) and/or silicon oxide (SiOx). A barrier layer (not shown) may be further disposed between the substrate 10 and the buffer layer 11. In an exemplary embodiment, the buffer layer 11 may be omitted.

The active layer 110 includes a semiconductor material, including for example, an inorganic semiconductor material such as amorphous silicon or polycrystalline silicon. However, the present invention is not limited thereto. For example, the active layer 110 may include an organic semiconductor material or oxide semiconductor material.

The gate insulating layer 13 may be disposed over the substrate 10 and cover the active layer 110. The gate insulating layer 13 may have a single-layered structure or a multi-layered structure including an inorganic material. For example, the gate insulating layer may include silicon oxide ($SiO_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZrO$_2$), or a combination thereof.

A first conductive layer including a conductive material is formed on the gate insulating layer 13 and is patterned to form the gate electrode 130 of the thin film transistor TFT. The gate electrode 130 may be connected to gate lines (not shown) for applying turning on/turning off signals to the thin film transistor TFT, and may include a low resistive metal material. For example, the gate electrode 130 may have a single-layered structure or a multi-layered structure including one or more materials including aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu). The gate electrode 130 may overlap with at least a part of the active layer 110 on a plane.

In an exemplary embodiment, the active layer 110 may be doped with n or p type impurities by using the gate electrode 130 as a mask. Accordingly, the active layer 110 may include a source region and a drain region doped with impurities, and a channel region between the source and drain regions.

Next, the interlayer insulating layer 15 is formed over the substrate 10. The interlayer insulating layer 15 covers the gate electrode 130. The interlayer insulating layer 15 may have a single-layered structure or a multi-layered structure including an inorganic material. For example, the interlayer insulating layer 15 may include silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZrO$_2$), or a combination thereof.

The interlayer insulating layer 15 and the gate insulating layer 13 are simultaneously etched to form at least two contact holes C1 and C2 exposing the active layer 110. The source region and the drain region of the active layer 110 may be exposed through the contact holes C1 and C2.

Next, a second conductive layer including a conductive material is formed on the interlayer insulating layer 15, and is patterned to form the source electrode 170 and the drain electrode 150 of the thin film transistor TFT. The source electrode 170 and the drain electrode 150 may each have a single-layered structure or a multi-layered structure including a conductive material having excellent conductivity. For example, the source electrode 170 and the drain electrode 150 may include the same material as that of the gate electrode 130. The source electrode 170 and the drain electrode 150 may be respectively connected to the source electrode and the drain electrode of the active layer 110 via the contact holes C1 and C2.

Figure 4B:
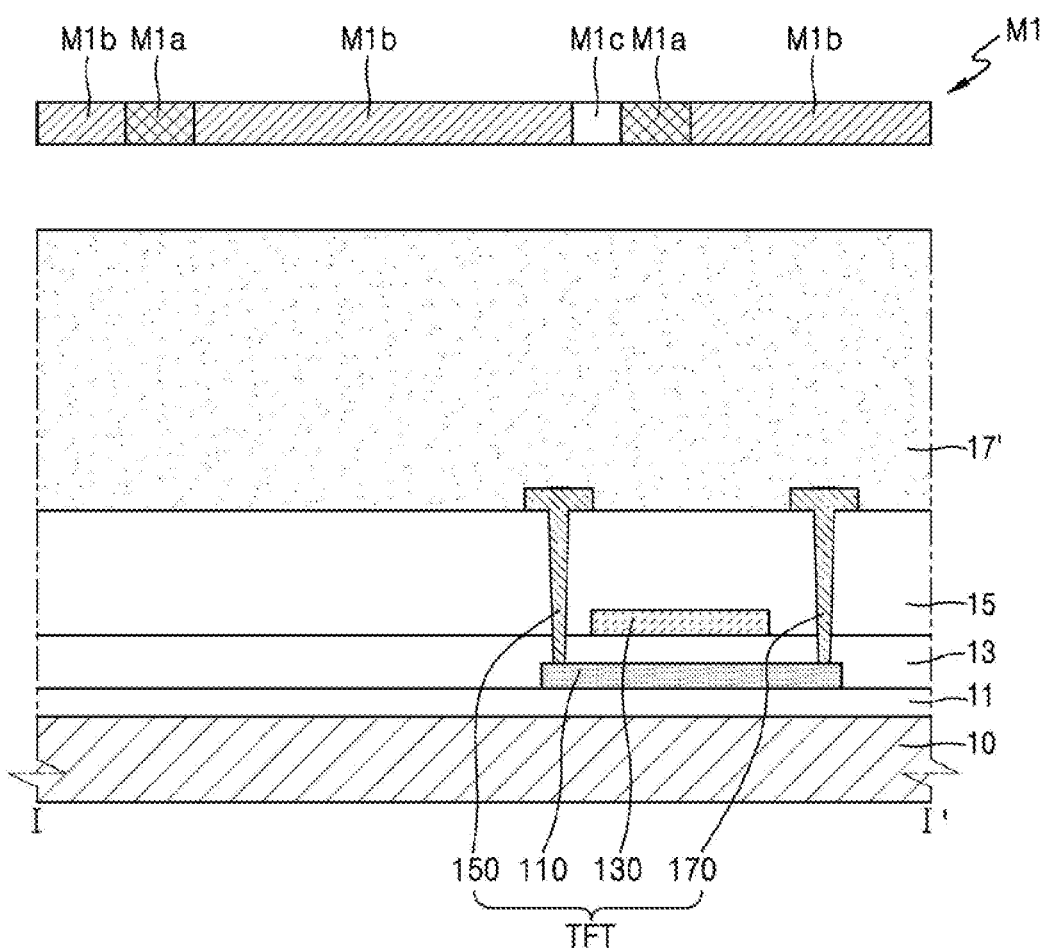

Referring to FIG. 4B, a first insulating layer 17' including an insulating material may be formed over the substrate 10 to cover the thin film transistor TFT. In addition, a half-tone mask M1 is aligned above the first insulating layer 17'.

The first insulating layer 17' may include a photosensitive organic material such as an acrylic resin, benzocyclobutene (BCB), PI, and a novolak-based resin. Here, the photosensitive organic material may be a negative photosensitive material or a positive photosensitive material.

In FIG. 4B, the first insulating layer 17' includes a negative photosensitive material, and in this case, the half-tone mask M1 may include a light transmission portion M1$a$, a semi-transmission portion M1$b$, and a light shield portion M1$c$. The light transmission portion M1$a$ corresponds to a region where the first insulating layer 17' will remain, the semi-transmission portion M1$b$ corresponds to a region where the first insulating layer 17' will be partially removed, and the light shield portion M1$c$ corresponds to a region where the first insulating layer 17' will be completely removed.

The first insulating layer 17' is exposed to light by using the half-tone mask M1.

Figure 4C:
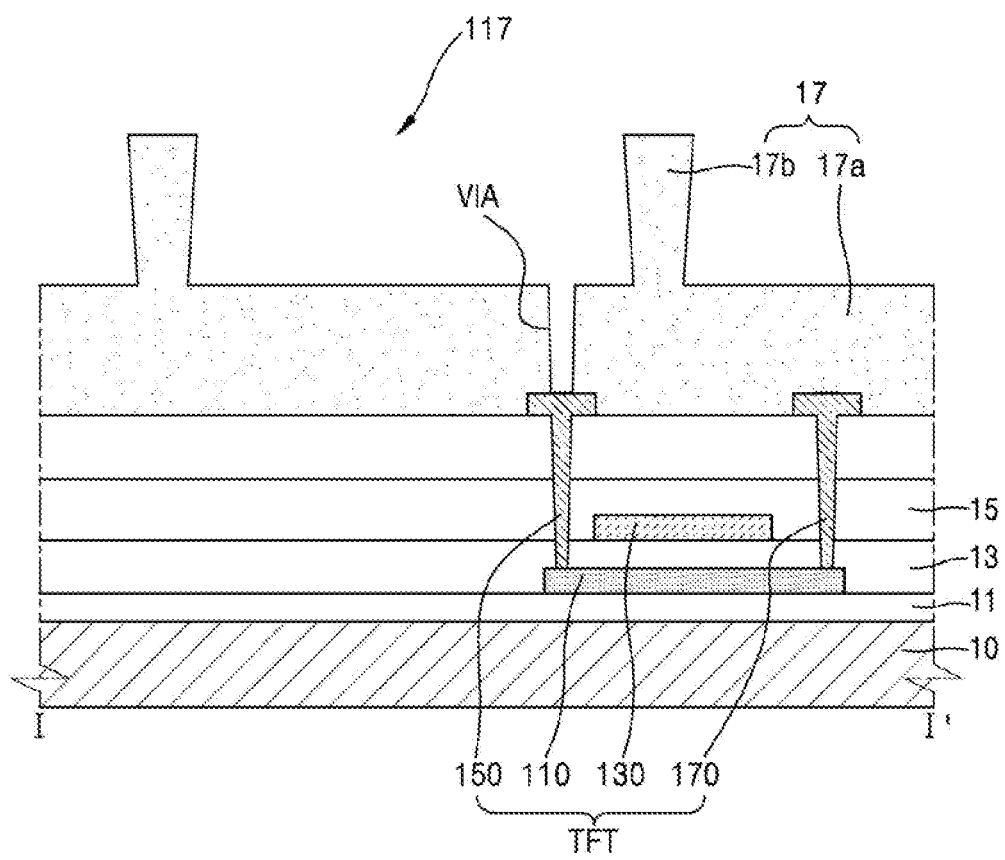

Referring to FIG. 4C, the first insulating layer 17' that has been exposed to light is developed to form the via insulating layer 17.

The first insulating layer 17' corresponding to the light shield portion M1$c$ of the half-tone mask M1 is completely removed, the first insulating layer 17' corresponding to the semi-transmission portion M1$b$ is partially removed, and the first insulating layer 17' corresponding to the light transmission portion M1$a$ remains. Here, the portion of the first insulating layer 17' corresponding to the semi-transmission portion M1$b$ has a thickness that is less than that of the portion corresponding to the light transmission portion M1$a$, and the thickness of the portion corresponding to the semi-transmission portion M1$b$ may be adjusted by a component ratio or a thickness of the material forming the semi-transmission portion M1$b$.

In the first insulating layer 17', the via hole VIA is formed in the portion corresponding to the light shield portion M1$c$, the flat portion 17$a$ is formed on the portion corresponding to the semi-transmission portion M1$b$, and the barrier wall 17$b$ may be formed on the portion corresponding to the light transmission portion M1$a$. As such, the via insulating layer 17 including the via hole VIA, the flat portion 17$a$, and the barrier wall 17$b$ may be formed. For example, the via insulating layer 17 including the via hole VIA, the flat portion 17$a$, and the barrier wall 17$b$ may be formed by one mask process using the half-tone mask M1.

The barrier wall 17$b$ may have the inverse-tapered shape, the width of which increases away from the flat portion 17$a$. In addition, a predetermined space, that is, the trench 117 of the inverse-tapered shape, may be formed on a space of the flat portion 17$a$ that is surrounded by the barrier wall 17$b$ of the via insulating layer 17.

The via hole VIA is located in the trench 117, and a part of the drain electrode 150 of the thin film transistor TFT may be exposed by the via hole VIA.

FIGS. 4B and 4C illustrate the exemplary embodiment for forming the via insulating layer 17 by using the negative photosensitive material. When the negative photosensitive material is used, a barrier wall may be patterned into an inverse-tapered shape, as shown in FIG. 4C. However, the present invention is not limited thereto. For example, the via insulating layer 17 may be formed by using a positive photosensitive material. Here, the half-tone mask M1 may include a light shield portion M1$a$, a semi-transmission portion M1$b$, and a light transmission portion M1$c$. The light shield portion M1$a$ is arranged to correspond to a region where the first insulating layer 17' will remain, the semi-transmission portion M1$b$ is arranged to correspond to a region where the first insulating layer 17' will be partially removed, and the light transmission portion M1$c$ is arranged to correspond to a region where the first insulating layer 17' will be completely removed. In a patterning process using a positive photosensitive material, the barrier wall 17$b$ may have a perpendicular shape or a tapered shape, a width of which is reduced away from the flat portion 17$a$, that is, an angle between an internal side surface of the barrier wall and a surface of the substrate is 90° or less. When the barrier wall has a perpendicular shape without a tapered surface, an upper width may be formed to be different from a lower width of the barrier wall by partially etching a lower outer surface of the barrier wall through an isotropic etching process.

Figure 4D:
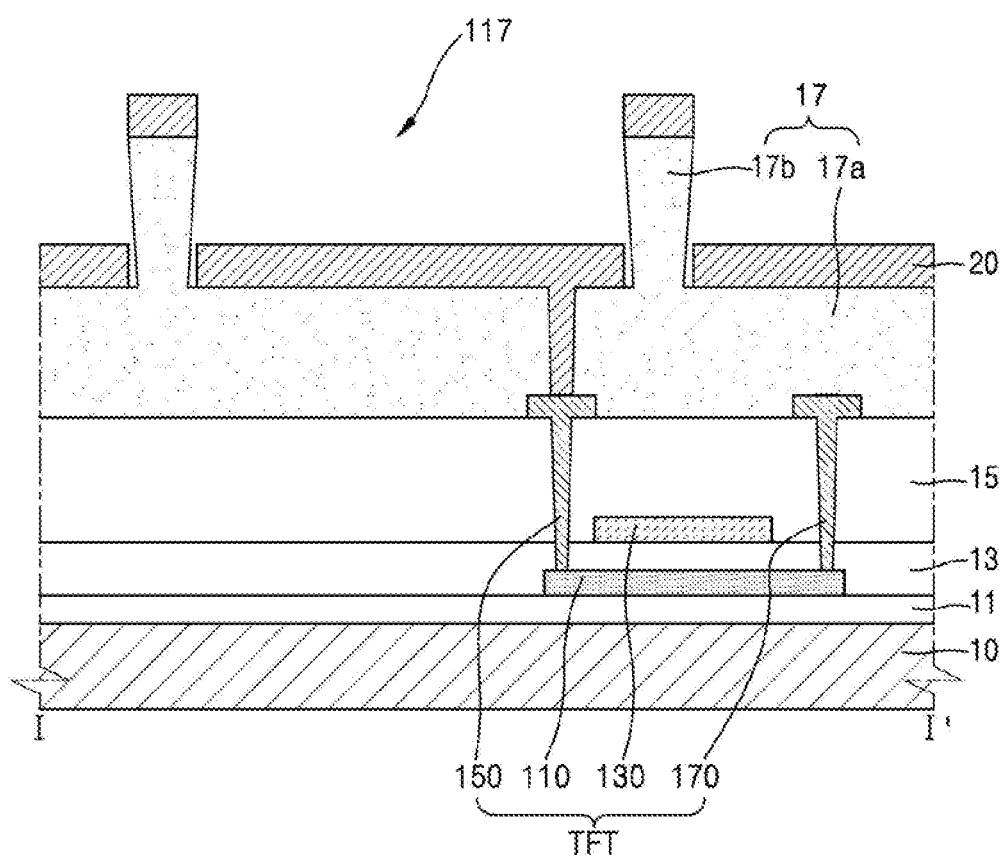

Referring to FIG. 4D, a third conductive layer 20 including a conductive material may be formed on the via insulating layer 17.

The third conductive layer 20 may be a reflective layer including Ag, Mg, Al, Pt, Pd, Au, Ni, Nd, Ir, Cr, or a compound thereof. In an exemplary embodiment, the third conductive layer 20 may further include a transparent conductive layer including indium tin oxide (ITO), indium zinc oxide (IZO), zinc oxide (ZnO), indium oxide ($In_2O_3$), indium gallium oxide (IGO), or aluminum zinc oxide (AZO), in addition to the reflective layer.

When the third conductive layer 20 is formed on the via insulating layer 17, the third conductive layer 20 is separated due to the thickness of the barrier wall 17b to be respectively disposed on an upper surface of the flat portion 17a and an upper surface of the barrier wall 17b. In addition, the third conductive layer 20 may be easily divided due to the inverse-tapered shape of the barrier wall 17b.

In an exemplary embodiment, the third conductive layer 20 may be deposited using a directional deposition method including a sputtering process. For example, since the sputtering process provides reactants to be deposited in a perpendicular to the substrate, for example, the reactants are not or scarcely so that the third conductive layer 20 is not deposited on the inverse-tapered shaped sidewall of the barrier wall 17b.

The third conductive layer 20 formed on the bottom surface of the trench 117 that is formed by the barrier wall 17b may be electrically connected to the drain electrode 150 of the thin film transistor TFT. The third conductive layer 20 may completely fill the via hole VIA in the trench 117. The third conductive layer 20 formed on the bottom surface of the trench 117 may act as the pixel electrode 210 later.

The third conductive layer 20 may be formed to have a predetermined gap GAP without contacting the lower side surface of the barrier wall 17b due to the inverse-tapered shape of the barrier wall 17b. However, the present invention is not limited thereto. For example, the third conductive layer 20 may contact the lower side surface of the barrier wall 17b without forming the gap GAP according to the thickness of the third conductive layer 20 and/or the conductive material forming the third conductive layer 20.

Figure 4E:
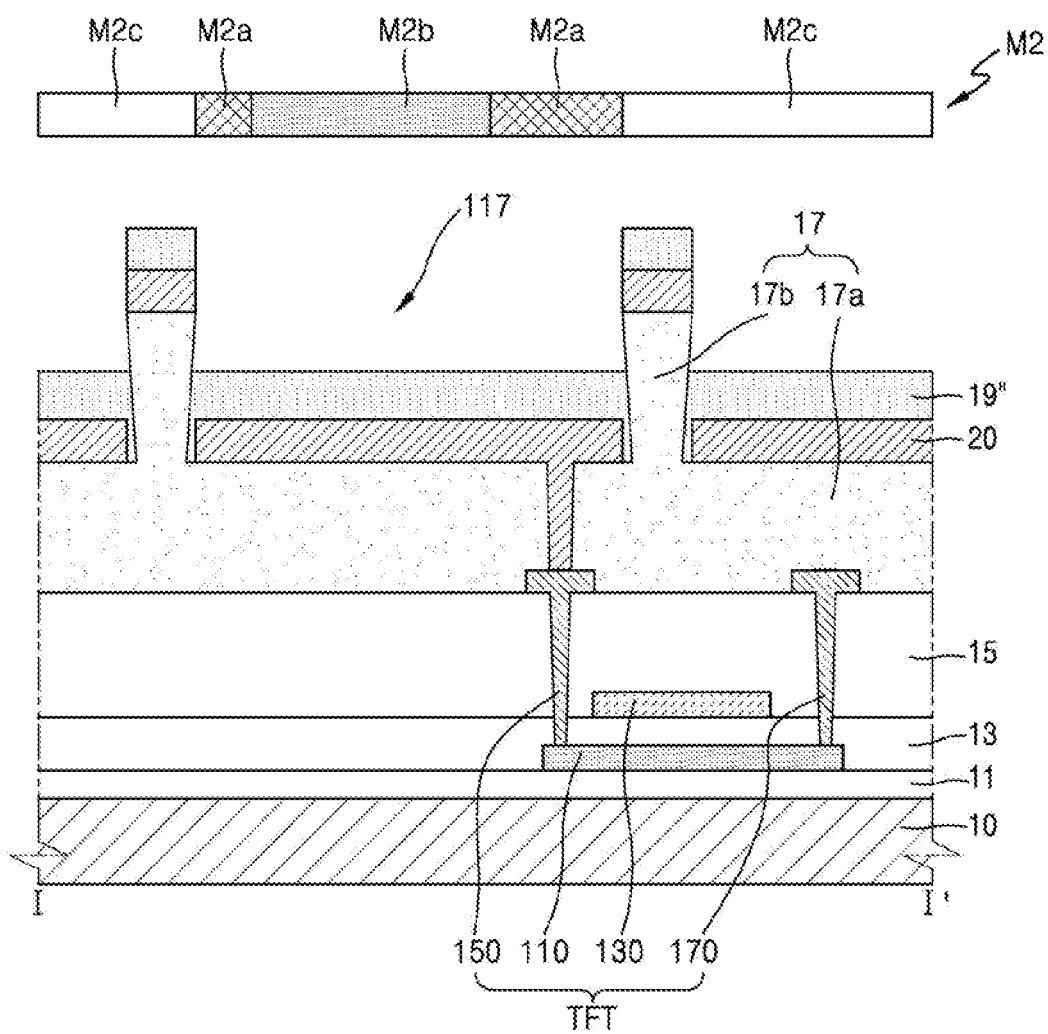

Referring to FIG. 4E, a second insulating layer 19″ including an insulating material may be formed on the third conductive layer 20. In addition, a half-tone mask M2 is aligned over the second insulating layer 19″.

The second insulating layer 19″ is formed on an upper surface of the third conductive layer 20. The second insulating layer 19″ may completely fill the gap GAP between the third conductive layer 20 and the barrier wall 17b. The second insulating layer 19″ is also separated and divided by the barrier wall 17b.

The second insulating layer 19″ may include a photosensitive organic material such as an acrylic resin, BCB, PI, and a novolak-based resin. Here, the photosensitive organic material may be a negative photosensitive material or a positive photosensitive material. An example in which the second insulating layer 19″ includes the positive photosensitive material will be described below with reference to FIG. 4E.

The half-tone mask M2 may include a light shield portion M2a, a semi-transmission portion M2b, and a light transmission portion M2c. The light shield portion M2a is arranged to correspond to a region where the second insulating layer 19″ will finally remain, the semi-transmission portion M2b is arranged to correspond to a region where the second insulating layer 19″ will partially remain after an ashing process, and the light transmission portion M2c is arranged to correspond to a region where the second insulating layer 19″ will be completely removed.

The second insulating layer 19″ is exposed to light by using the half-tone mask M2.

Figure 4F:
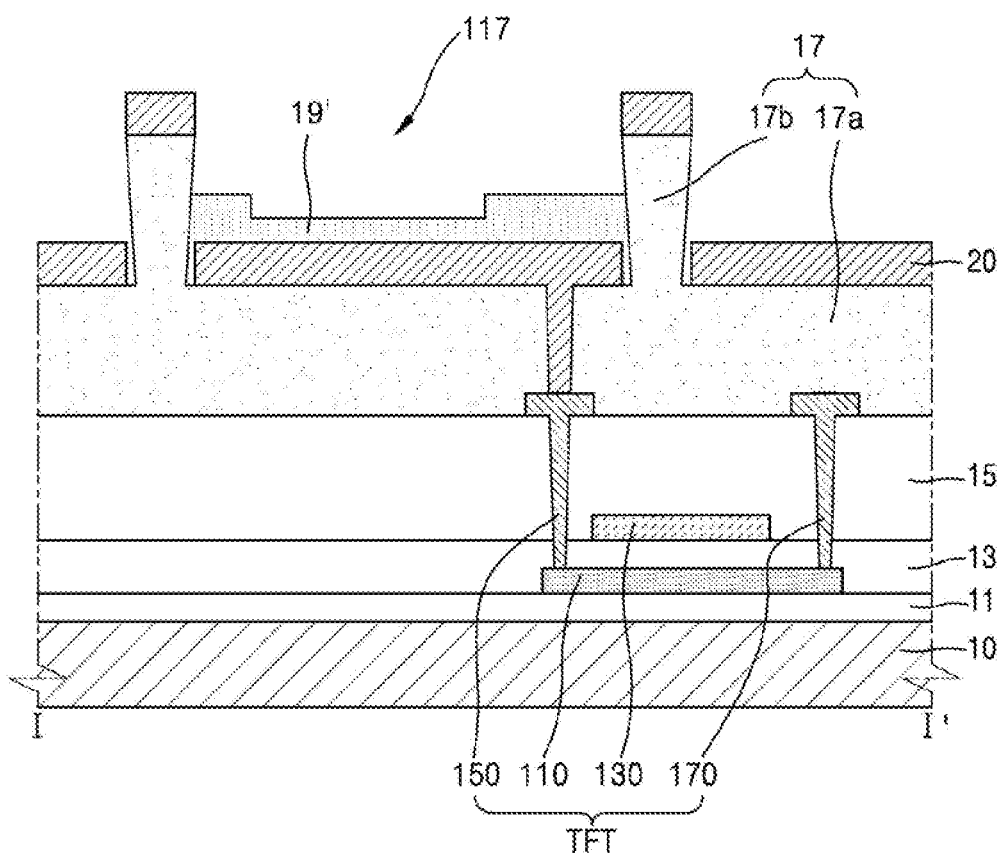

FIG. 4F schematically illustrates a second insulating layer pattern 19′ that remains after developing the second insulating layer 19″ that has been exposed to the light.

The portion of the second insulating layer 19″ corresponding to the light transmission portion M2c of the half-tone mask M2 is completely removed, the portion of the second insulating layer 19″ corresponding to the semi-transmission portion M2b is partially removed, and the portion of the second insulating layer 19″ corresponding to the light shield portion M2a remains. Here, the portion of the second insulating layer 19″ corresponding to the semi-transmission portion M2b has a thickness that is less than that of the second insulating layer 19″ corresponding to the light shield portion M2a, and the thickness may be adjusted by the component ratio or a thickness of the material forming the semi-transmission portion M2b.

Since the second insulating layer 19″ is completely removed from the portion corresponding to the light transmission portion M2c, the third conductive layer 20 is exposed.

Figure 4G:
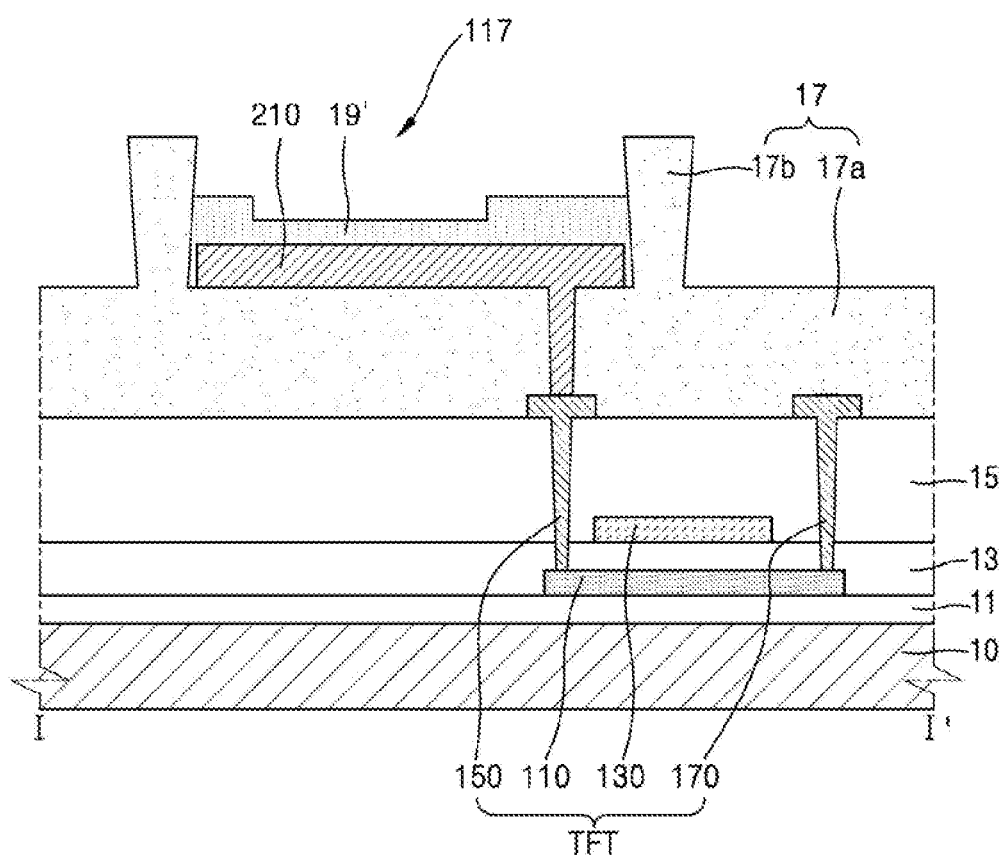

Referring to FIG. 4G, the second insulating layer pattern 19′ remaining after the process illustrated in FIG. 4F is used as an etch mask to remove the third conductive layer 20 that is exposed. Here, the second insulating layer pattern 19′ may be etched to a partial thickness. The etching may be performed by various methods, such as a wet etching method or a dry etching method.

Due to the etching, the third conductive layer 20 disposed in the trench 117 only remains to form the pixel electrode 210.

Figure 4H:
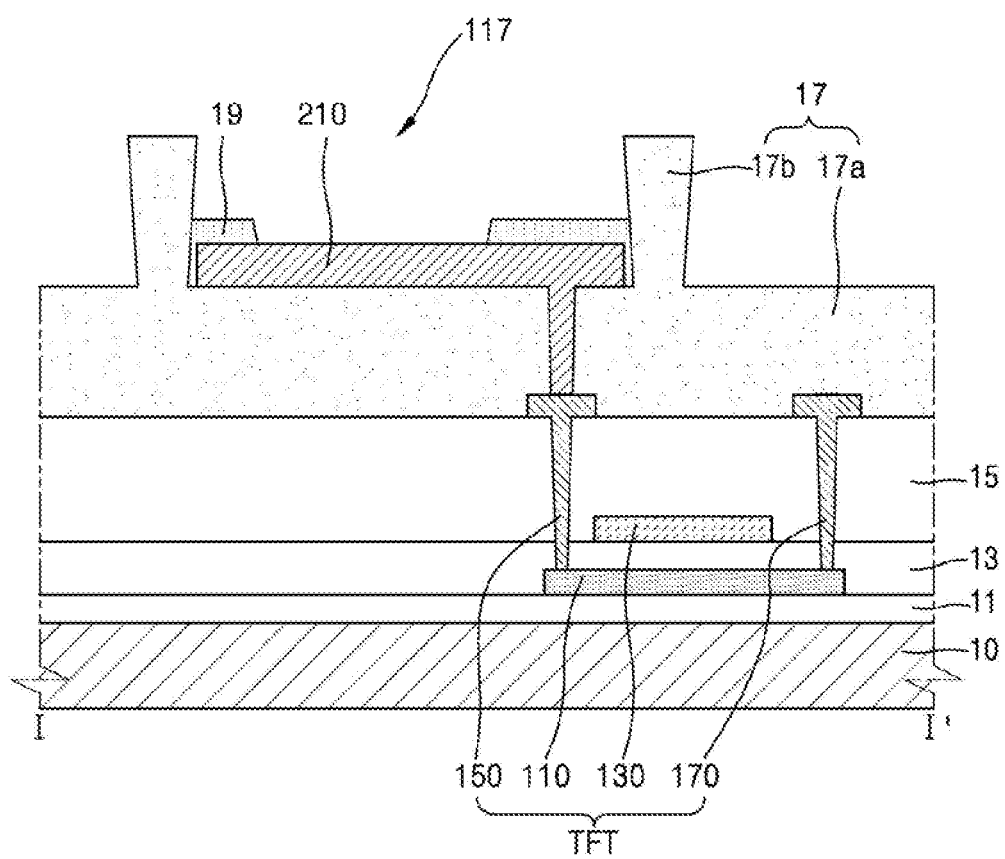

Referring to FIG. 4H, the second insulating layer pattern 19′ may be partially removed by an ashing process. A height of the second insulating layer pattern 19′ may be reduced through the ashing process.

The portion of the second insulating layer pattern 19′ corresponding to the semi-transmission portion M2b is completely removed by the ashing process so that the pixel electrode 210 may be partially exposed.

A portion of the second insulating layer pattern 19′ corresponding to the light shield portion M2a is lowered in height by the ashing process to be formed as the pixel defining layer 19 that covers the pixel electrode 210 partially. The pixel defining layer 19 covers an upper surface and a side surface of a portion in the pixel electrode 210 (e.g., the second region 210b of the pixel electrode 210). After that, the pixel defining layer 19 may be cured. In an exemplary embodiment, the pixel electrode 210 and the pixel defining layer 19 may be obtained by one mask process using the half-tone mask M2.

Figure 4I:
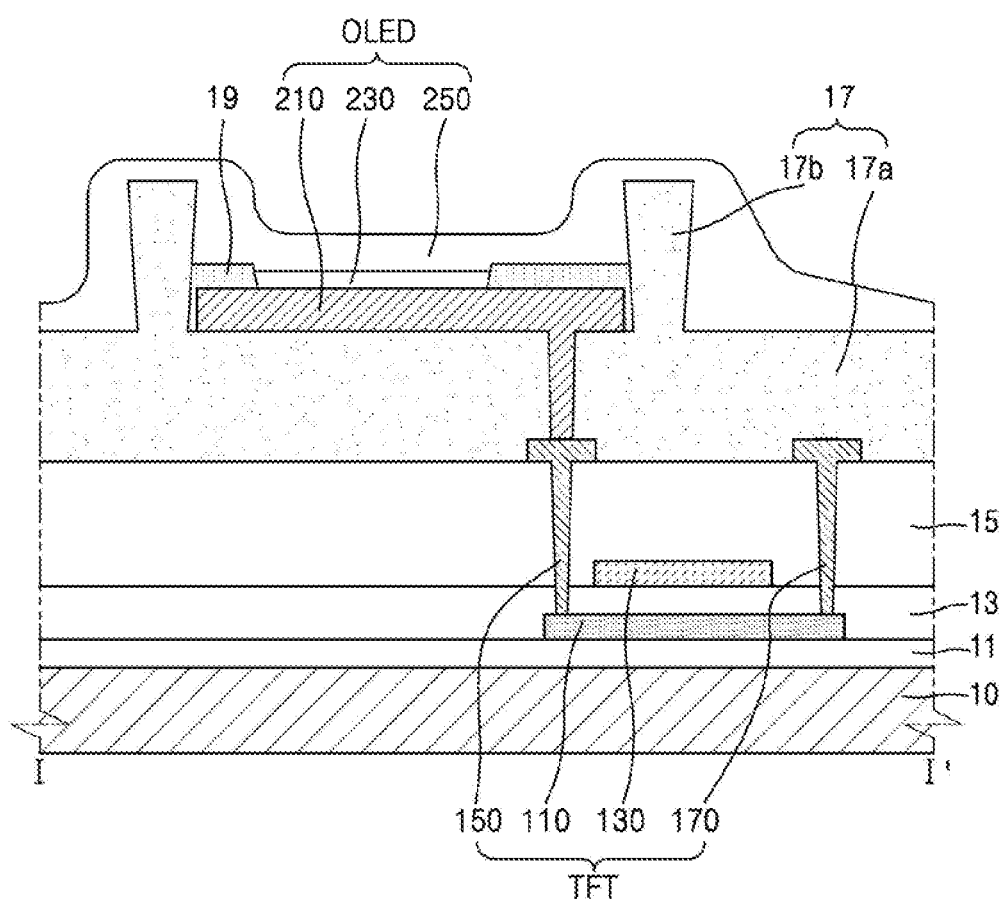

Referring to FIG. 4I, an organic emission layer 230 is formed on a portion of the pixel electrode 210, wherein the portion is exposed by the pixel defining layer 19, and an opposite electrode 250 is formed on the organic emission layer 230 to configure an organic light-emitting diode OLED.

The organic emission layer 230 may include a low molecular weight organic material or a polymer organic material. The organic emission layer may be disposed in each of organic light-emitting diodes OLED by using an FMM, and in this case, the organic light-emitting diode OLED may emit red light, green light, or blue light according to the type of the organic emission layer 230 included therein. However, the present invention is not limited thereto, and a plurality of organic emission layers 230 may be disposed in one organic light-emitting diode OLED. For example, a plurality of organic emission layers 230 emitting red light, green light, and blue light may be vertically stacked or mixed to emit white light. In this case, a color conversion layer or a color filter may be further provided to convert white light into a predetermined color. However, the above red, green, and blue light are exemplarily provided, and combination of colors for emitting white light is not limited thereto.

Although not shown, at least one functional layer from a hole injection layer, a hole transport layer, an electron transport layer, and an electron injection layer may be further disposed between the pixel electrode 210 and the organic emission layer 230 and/or between the organic emission layer 230 and the opposite electrode 250. According to an exemplary embodiment, other various functional layers may be further disposed between the pixel electrode 210 and the opposite electrode 250, in addition to the above-described layers. The functional layers may be formed as common layers for the plurality of organic light-emitting diodes OLED in a plurality of pixels, by using an open mask.

The opposite electrode 250 may include various conductive materials. For example, the opposite electrode 250 may include a semi-transmissive reflective layer including Li, Ca, lithium fluoride (LiF), Al, Mg, Ag, or a light transmitting metal oxide such as ITO, IZO, and ZnO, and may have a single-layered structure or a multi-layered structure.

Although not shown in the drawings, according to an exemplary embodiment, a thin film encapsulation layer may be disposed on the opposite electrode 250, wherein the thin film encapsulation layer encapsulates the organic light-emitting diode OLED and includes at least one organic layer and at least one inorganic layer. The thin film encapsulation layer encapsulates the organic light-emitting diode OLED so that the organic light-emitting diode OLED does not expose to external air or impurities. The thin film encapsulation layer may have a thickness to the extent that a flexible display apparatus is bendable and foldable.

Figure 5:
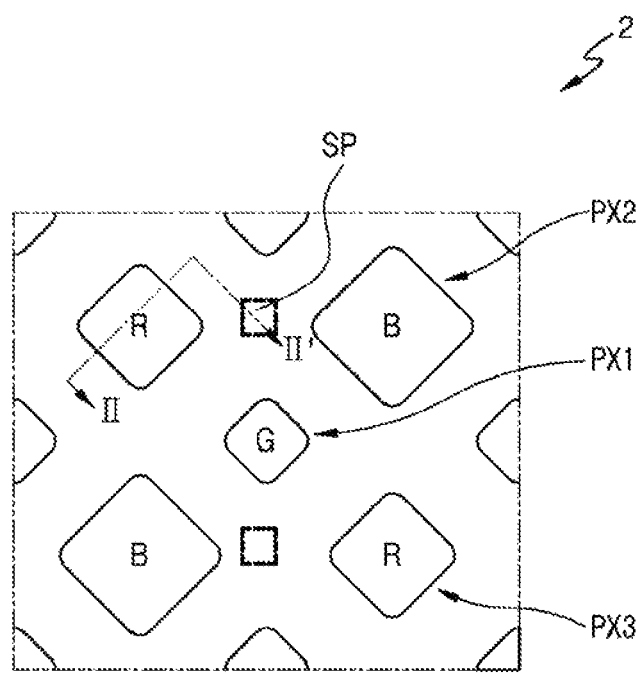
FIG. 5 is a partial plan view of an organic light-emitting display apparatus according to an embodiment.
Figure 6:
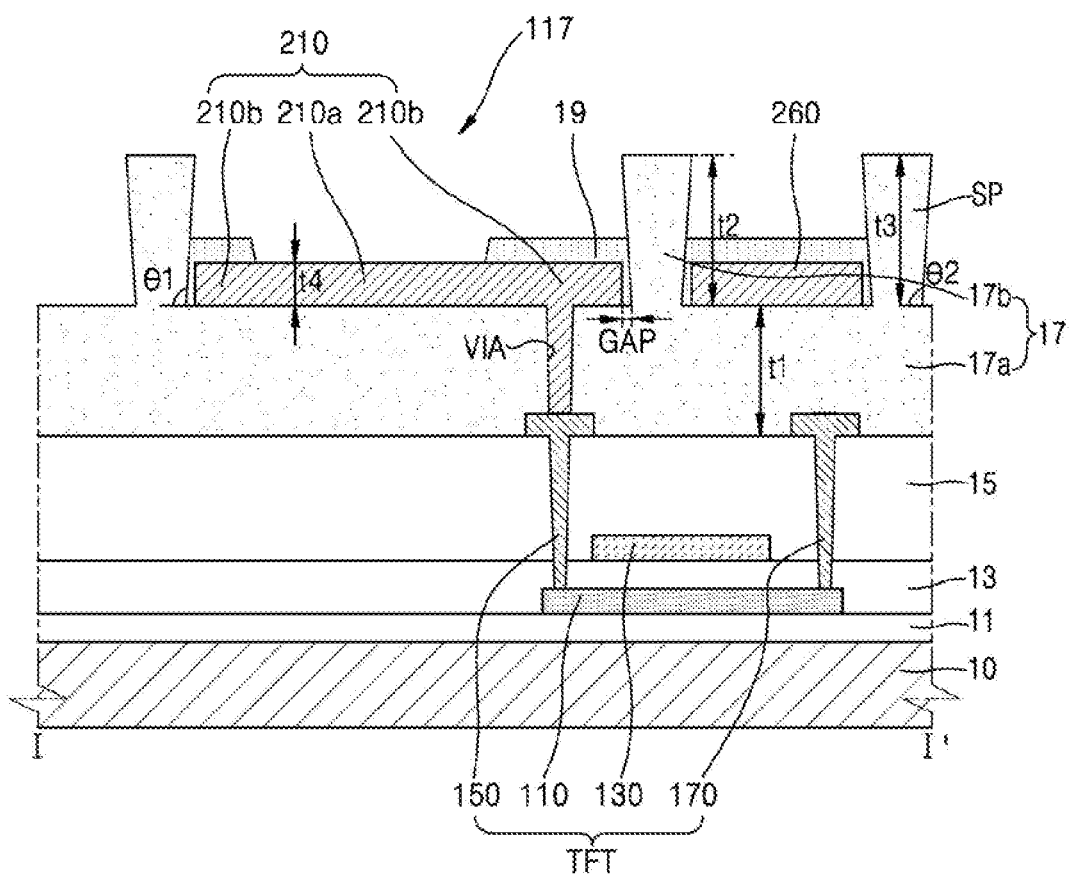
FIG. 6 is a cross-sectional view of the organic light-emitting display apparatus, taken along a line II-II' of FIG. 5.

FIG. 5 is a partial plan view of an organic light-emitting display apparatus 2 according to an exemplary embodiment, and FIG. 6 is a cross-sectional view of the organic light-emitting display apparatus 2, taken along line II-II' of FIG. 5.

The organic light-emitting display apparatus 2 illustrated with reference to FIGS. 5 and 6 is different from the organic light-emitting display apparatus 1 illustrated with reference to FIGS. 1 to 3 in view of further including a wiring 260 and a spacer SP, and other elements are the same as those of the organic light-emitting display apparatus 1. Thus, for the convenience of description, the descriptions of the same elements as those illustrated with reference to FIGS. 1 to 3 are omitted.

Referring to FIGS. 5 and 6, a plurality of first pixels PX1, a plurality of second pixels PX2, and a plurality of third pixels PX3 may be repeatedly arranged according to a predetermined pattern on a display area of the organic light-emitting display apparatus 2.

The first pixels PX1 may be green pixels G, the second pixels PX2 may be blue pixels B, and the third pixels PX3 may be red pixels R. Planar arrangement of the first to third pixels PX1, PX2, and PX3 shown in FIG. 5 is equal to that of FIG. 2.

The organic light-emitting display apparatus 2 includes the thin film transistor TFT disposed on the display area of the substrate 10, the via insulating layer 17 covering the thin film transistor TFT, the pixel electrode 210 disposed on the via insulating layer 17 and electrically connected to the thin film transistor TFT, and the pixel defining layer 19 covering the pixel electrode 210 partially. The wiring 260 and the spacer SP may be disposed on the via insulating layer 17 around the pixel electrode 210, to be spaced apart from the pixel electrode 210.

The thin film transistor TFT includes the active layer 110 disposed on the buffer layer 11, the gate electrode 130 insulated from the active layer 110 and disposed over at least a part of the active layer 110, the source electrode 170, and the drain electrode 150 electrically connected to the pixel electrode 210. The gate insulating layer 13 is disposed between the active layer 110 and the gate electrode 130, and the interlayer insulating layer 15 may be disposed between the gate electrode 130 and the source electrode 170 and between the gate electrode 130 and the drain electrode 150. The source electrode 170 and the drain electrode 150 may be respectively connected to the source region and the drain region of the active layer 110.

The via insulating layer 17 covering the thin film transistor TFT may be disposed on the thin film transistor TFT.

The via insulating layer 17 includes the via hole VIA, the flat portion 17a having a first thickness t1, the barrier wall 17b protruding from the flat portion 17a to a second thickness t2, and the spacer SP protruding from the flat portion 17a to a third thickness t3.

An upper surface of the flat portion 17a may be parallel with a surface of the substrate 10.

The barrier wall 17b may have a similar shape to that of the pixel electrode 210 when it is seen from a plane (in a plan view). An angle θ1 between an internal side surface of the barrier wall 17b and the surface of the substrate 10, that is, the upper surface of the flat portion 17a, may be 90° or greater. The barrier wall 17b surrounds the pixel electrode 210 along edges of the pixel electrode 210. In an exemplary embodiment, the pixel electrode 210 may be disposed on a bottom surface of the trench 117 formed on the via insulating layer 17 by the barrier wall 17b.

An angle θ2 between an internal side surface of the spacer SP and the surface of the substrate 10, that is, the upper surface of the flat portion 17a, may be 90° or greater. For example, the spacer SP may have inverse-tapered shape, a width of which increases away from the flat portion 17a. As another example, the spacer SP may have a constant width. The spacer SP may be disposed between the pixels at a predetermined interval. The spacer SP may be disposed around the wiring 260 that is formed at the same layer level as that of the pixel electrode 210 and includes the same material as that of the pixel electrode 210. In an exemplary embodiment, the angle θ2 and the angle θ1 may be substantially the same. In an exemplary embodiment, the angle θ2 and the angle θ1 may be different from each other.

The second thickness t2 of the barrier wall 17b and the third thickness t3 of the spacer SP are greater than a fourth thickness t4 of the pixel defining layer 19. For example, the second thickness t2 of the barrier wall 17b and the third thickness t3 of the spacer SP may be equal to each other, for example, about 3 μm to about 4 μm.

In the embodiment, the thickness of the barrier wall 17b may be sufficient to prevent damage on the pixel electrode 210 due to a mask during a deposition process using an FMM for forming an organic emission layer in each of the pixels emitting light of different colors, and the thickness of the spacer SP may prevent damage on the wiring 260 that is formed at the same layer level as that of the pixel electrode 210 and includes the same material. Therefore, the reliability of the deposition process may be increased.

The pixel electrode 210 may be electrically connected to the thin film transistor TFT via the via hole VIA located in the trench 117. The pixel electrode 210 may include the first region 210a on which the organic emission layer is disposed, and the second region 210b at the periphery of the first region 210a.

Shape of the each pixel PX may be dependent upon the shape of the first region 210a in the pixel electrode 210. The second region 210b of the pixel electrode 210 is covered by the pixel defining layer 19, and a part of the second region 210b may be located on the via hole VIA.

The pixel electrode 210 is spaced apart from the barrier wall 17b as a predetermined gap GAP is formed therebetween. The pixel defining layer 19 may be disposed in the gap GAP between the pixel electrode 210 and the barrier wall 17b. The pixel defining layer 19 covers the second region 210b of the pixel electrode 210. The pixel defining layer 19 completely fills the gap GAP between the pixel electrode 210 and the barrier wall 17b. The pixel electrode 210 is on the flat portion 17a surrounded by the barrier wall 17b.

The wiring 260 may be spaced apart from the pixel electrode 210 and on the flat portion 17a of an outer side of the barrier wall 17b, that is, between at least two barrier walls 17b. The wiring 260 is not limited to a particular kind. In an exemplary embodiment, the wiring 260 may be a data line or an initialization voltage line or power voltage line, etc, and is electrically connected to lines located at different layers to be used as an auxiliary line. An upper surface and a side surface of the wiring 260 may be completely covered by an insulating layer 19a (see FIG. 7G) including the same material as the pixel defining layer 19. The spacer SP may be disposed around the wiring 260. The spacer SP may be spaced apart from the wiring 260. The insulating layer 19a may be separated from the pixel defining layer 19 due to the barrier wall 17b.

FIGS. 7A to 7H are cross-sectional views showing processes of manufacturing the organic light-emitting display apparatus 2 of FIG. 5.

Figure 7A:
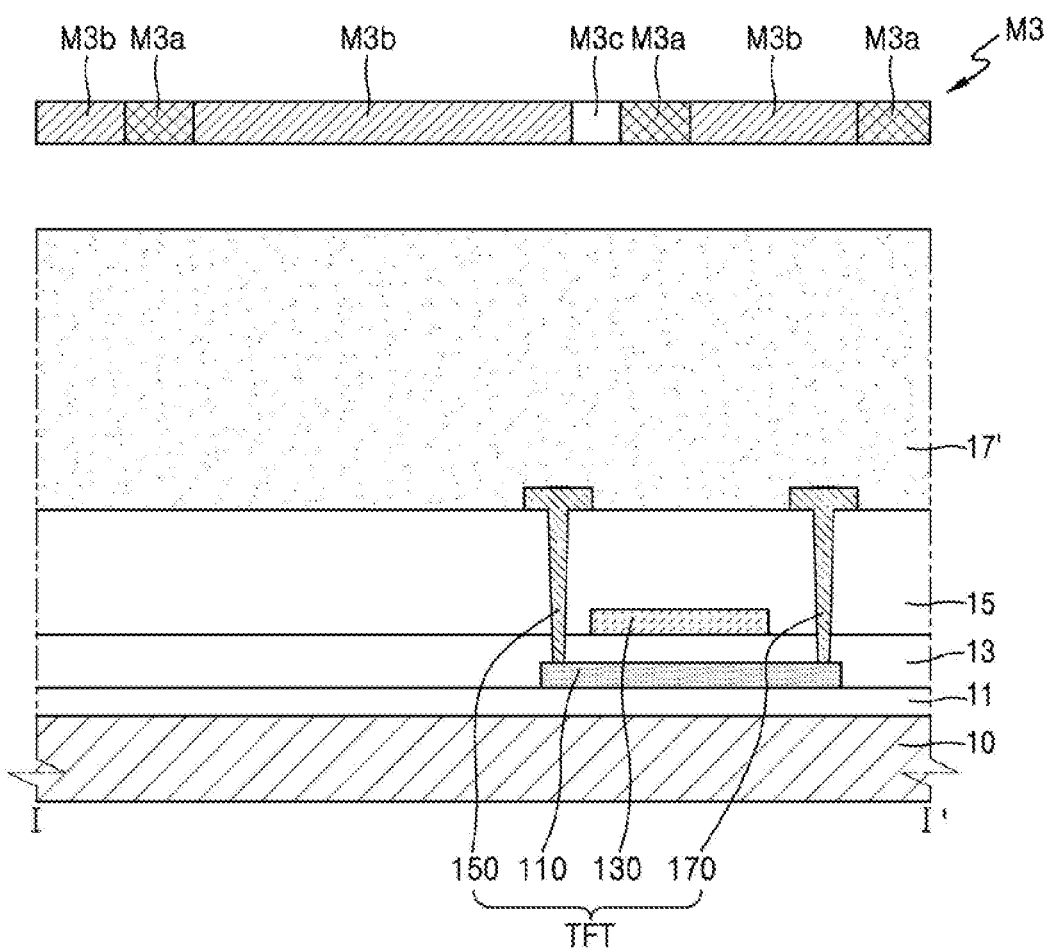
FIGS. 7A to 7H are cross-sectional views showing processes of manufacturing the organic light-emitting display apparatus of FIG. 5.

Referring to FIG. 7A, the thin film transistor TFT is formed on the substrate 10, and a first insulating layer 17' may be formed to cover the thin film transistor TFT by using an insulating material. In addition, a half-tone mask M3 is aligned over the first insulating layer 17'.

Since the processes of forming the thin film transistor TFT are described above with reference to FIG. 4A, descriptions of the processes are omitted. Hereinafter, descriptions of the elements that are described above with reference to FIG. 4A to 4I will be omitted.

The first insulating layer 17' may include a photosensitive organic material. The photosensitive organic material may be a negative photosensitive material.

The half-tone mask M3 may include a light transmission portion M3a, a semi-transmission portion M3b, and a light shield portion M3c. The light transmission portion M3a is arranged to correspond to a region where the first insulating layer 17' will remain, the semi-transmission portion M3b is arranged to correspond to a region where the first insulating layer 17' will be partially removed, and the light shield portion M3c is arranged to correspond to a region where the first insulating layer 17' will be completely removed.

The first insulating layer 17' is exposed to light by using the half-tone mask M3 as a mask.

Figure 7B:
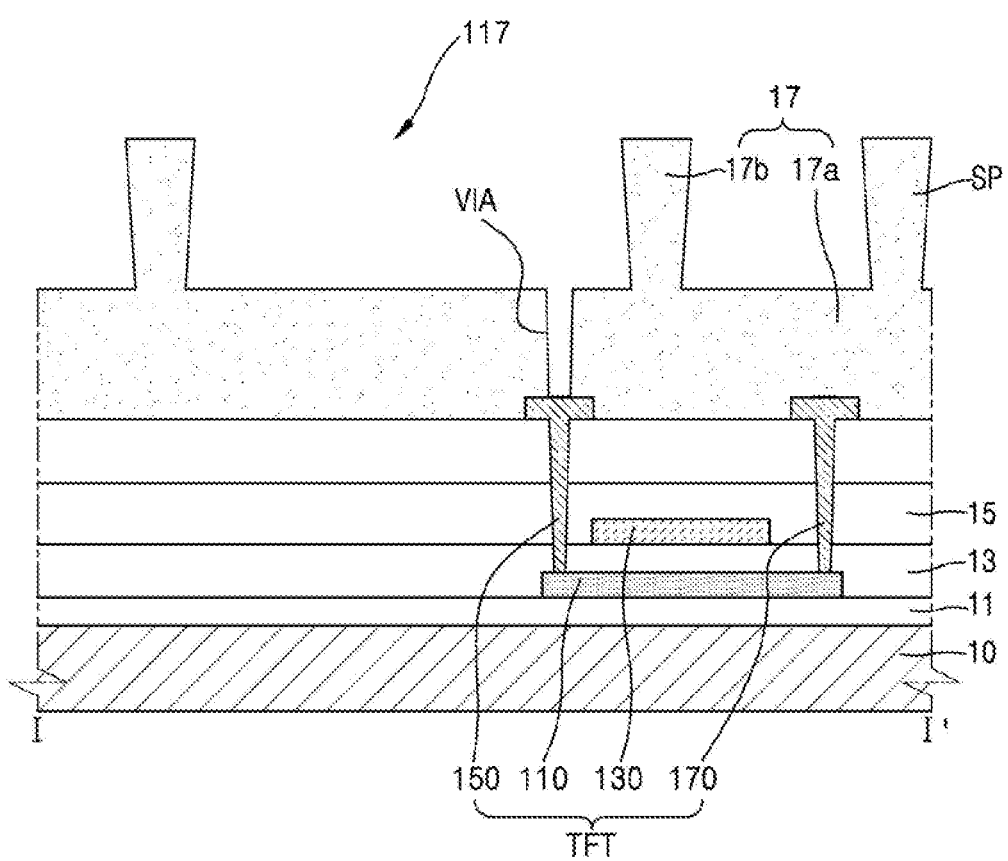

Referring to FIG. 7B, the first insulating layer 17' that has been exposed to the light is developed to form the via insulating layer 17.

The portion of the first insulating layer 17' corresponding to the light shield portion M3c of the half-tone mask M3 is completely removed, the portion of the first insulating layer 17' corresponding to the semi-transmission portion M3b is partially removed, and the portion of the first insulating layer 17' corresponding to the light transmission portion M3a remains. Here, a thickness of the portion of the first insulating layer 17' corresponding to the semi-transmission portion M3b is less than that of the first insulating layer 17' corresponding to the light transmission portion M3a, and the thickness may be adjusted by using a component ratio or a thickness of the material forming the semi-transmission portion M3b.

In the first insulating layer 17', the via hole VIA may be formed in the portion corresponding to the light shield portion M3c, the flat portion 17a may be formed on the portion corresponding to the semi-transmission portion M3b, and the barrier wall 17b and the spacer SP may be formed on the portion corresponding to the light transmission portion M3a. As such, the via insulating layer 17 including the via hole VIA, the flat portion 17a, the barrier wall 17b, and the spacer SP may be obtained. For example, the via insulating layer 17 including the via hole VIA, the flat portion 17a, the barrier wall 17b, and the spacer SP may be formed by one mask process using the half-tone mask M3.

The barrier wall 17b and the spacer SP may each have the inverse-tapered shape having an inclined side surface, a width of which increases away from the flat portion 17a. In addition, the trench 117 of the inverse-tapered shape may be formed on the region of the flat portion 17a of the via insulating layer 17. The trench 117 may be surrounded by the barrier wall 17b. The via hole VIA is located in the trench 117, and the drain electrode 150 of the thin film transistor TFT may be partially exposed by the via hole VIA.

FIGS. 7A and 7B illustrate the via insulating layer 17 formed by using the negative photosensitive material. When the negative photosensitive material is used, the barrier wall 17b and the spacer SP having the inverse-tapered shapes may be patterned as shown in FIG. 7B. However, the present invention is not limited thereto. For example, the via insulating layer 17 may be formed by using a positive photosensitive material. Here, the half-tone mask M3 may include a light shield portion M3a, a semi-transmission portion M3b, and a light transmission portion M3c. The light shield portion M3a is arranged to correspond to a region where the first insulating layer 17' will remain, the semi-transmission portion M3b is arranged to correspond to a region where the first insulating layer 17' will be partially removed, and the light transmission portion M3c is arranged to correspond to a region where the first insulating layer 17' will be completely removed. When the patterning is performed by using a positive photosensitive material, the barrier wall 17b and the spacer SP may have perpendicular shapes without a tapered portion. In this case, a lower outer side surface of the barrier wall 17b and the spacer SP may be partially etched by an isotropic etching process so that the barrier wall 17b and the spacer SP may each have an upper width and a lower width that are different from each other.

Figure 7C:
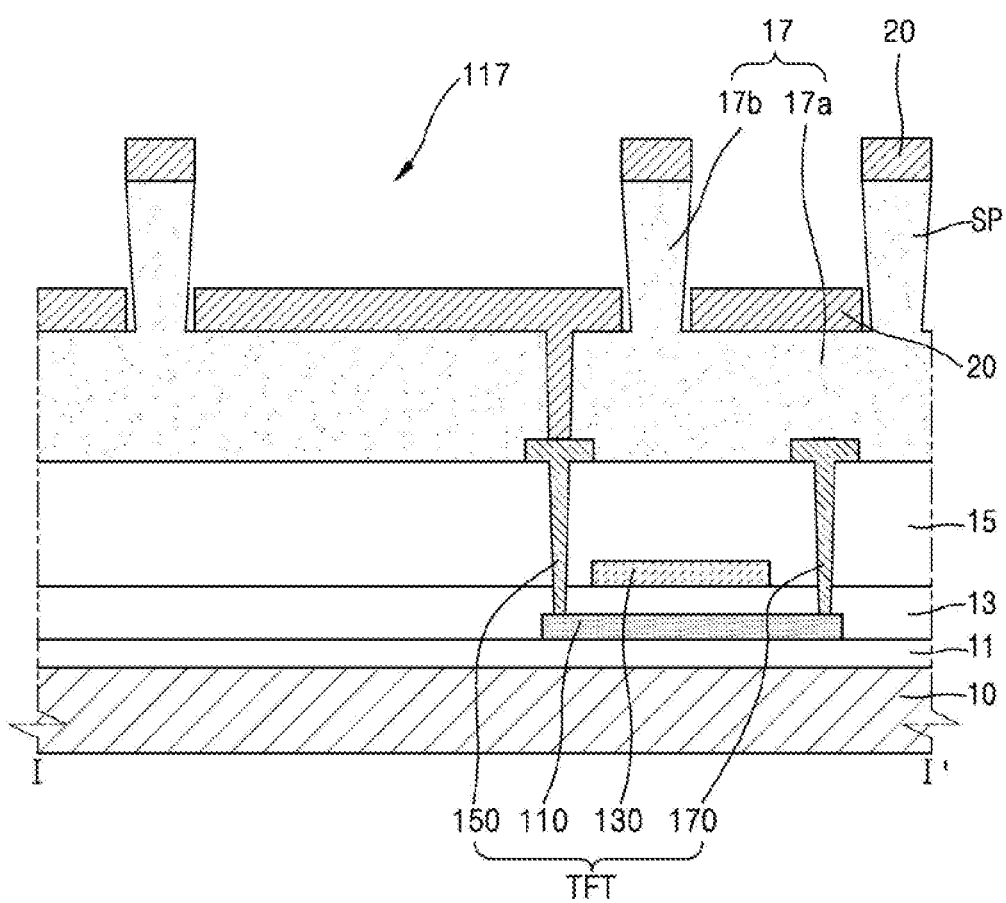

Referring to FIG. 7C, the third conductive layer 20 including a conductive material may be formed on the via insulating layer 17.

When the third conductive layer 20 is deposited on the via insulating layer 17, the third conductive layer 20 is separated due to the barrier wall 17b and the spacer SP and then is disposed on the upper surface of the flat portion 17a, and the upper portions of the barrier wall 17b and the spacer SP. In addition, the third conductive layer 20 may be divided due to the inverse-tapered shapes of the barrier wall 17b and the spacer SP, because the conductive layer 20 is not deposited on the inverse-tapered shaped sidewall of the barrier wall 17b and the inverse-tapered shaped sidewall of the spacer SP.

The third conductive layer 20 disposed on a bottom surface of the trench 117 that is formed by the barrier wall 17b may be electrically connected to the drain electrode 150 of the thin film transistor TFT. The third conductive layer 20 may completely fill the via hole VIA in the trench 117. The third conductive layer 20 disposed on the bottom surface of the trench 117 may function as the pixel electrode 210 later.

Due to the inverse-tapered shape of the barrier wall 17b and the spacer SP, the third conductive layer 20 may be formed with a predetermined gap GAP disposed between the third conductive layer 20 and the barrier wall 17b without contacting a lower side surface of the barrier wall 17b. However, the present invention is not limited thereto. For example, the third conductive layer 20 may contact the lower side surfaces of the barrier wall 17b and the spacer SP without forming the gap GAP, according to the thickness of the third conductive layer 20 and/or the conductive material forming the third conductive layer 20.

Figure 7D:
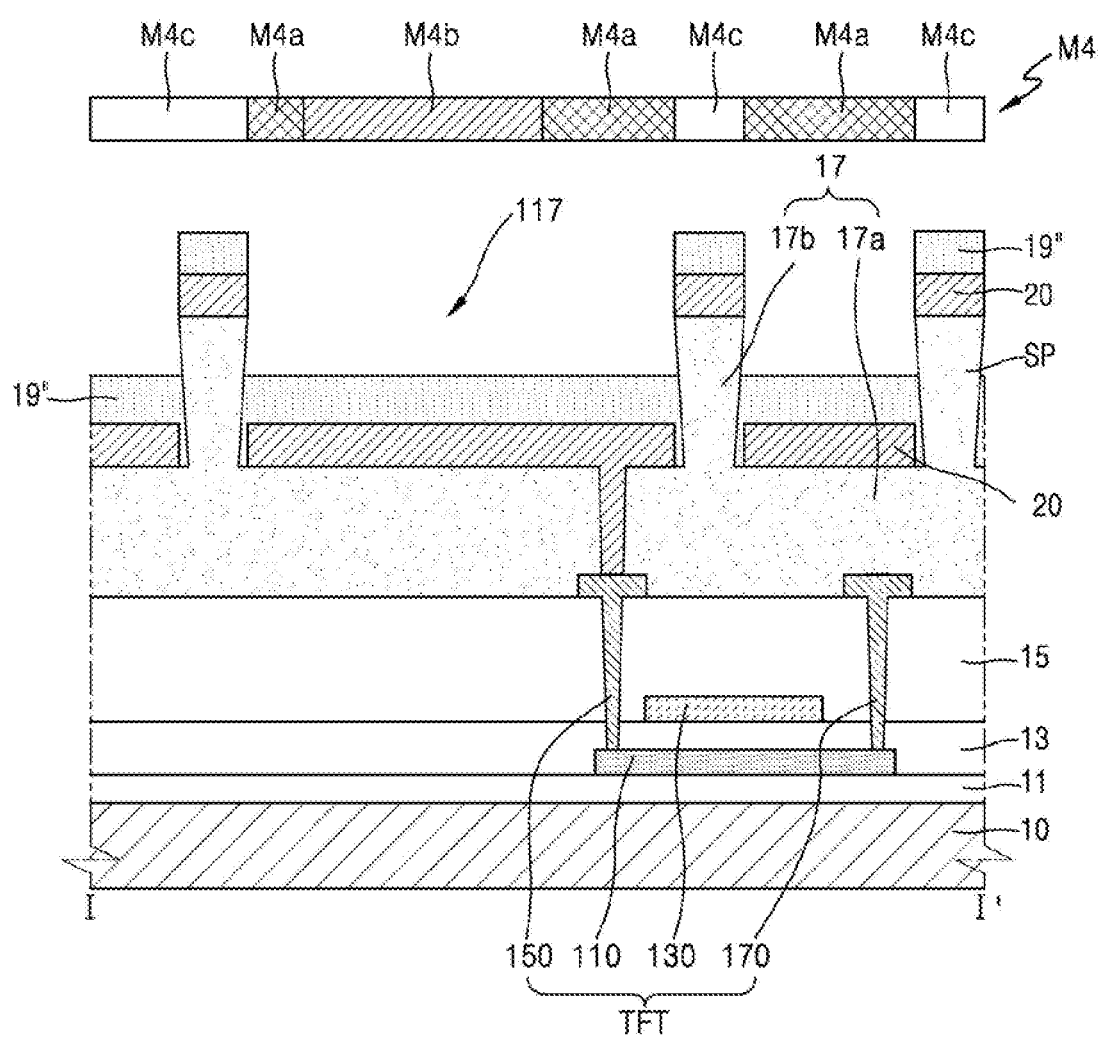

Referring to FIG. 7D, the second insulating layer 19″ including an insulating material may be formed on the third conductive layer 20. In addition, a half-tone mask M4 is aligned above the second insulating layer 19″.

The second insulating layer 19″ is formed on an upper surface of the third conductive layer 20. The second insulating layer 19″ may completely fill the gap GAP formed between the third conductive layer 20 and the barrier wall 17b and the spacer SP. The second insulating layer 19″ is also divided by the barrier wall 17b and the spacer SP.

The second insulating layer 19″ may include a photosensitive organic material. The photosensitive organic material may be a negative photosensitive material or a positive photosensitive material. In FIG. 7D, the second insulating layer 19″ includes the positive photosensitive material.

The half-tone mask M4 may include a light shield portion M4a, a semi-transmission portion M4b, and a light transmission portion M4c. The light shield portion M4a is arranged to correspond to a portion where the second insulating layer 19″ will finally remain, the semi-transmission portion M4b is arranged to correspond to a portion where the second insulating layer 19″ will partially remain and will be removed by an ashing, and the light transmission portion M4c is arranged to correspond to a portion where the second insulating layer 19″ will be completely removed.

The second insulating layer 19″ is exposed to light by using the half-tone mask M4 as a mask.

Figure 7E:
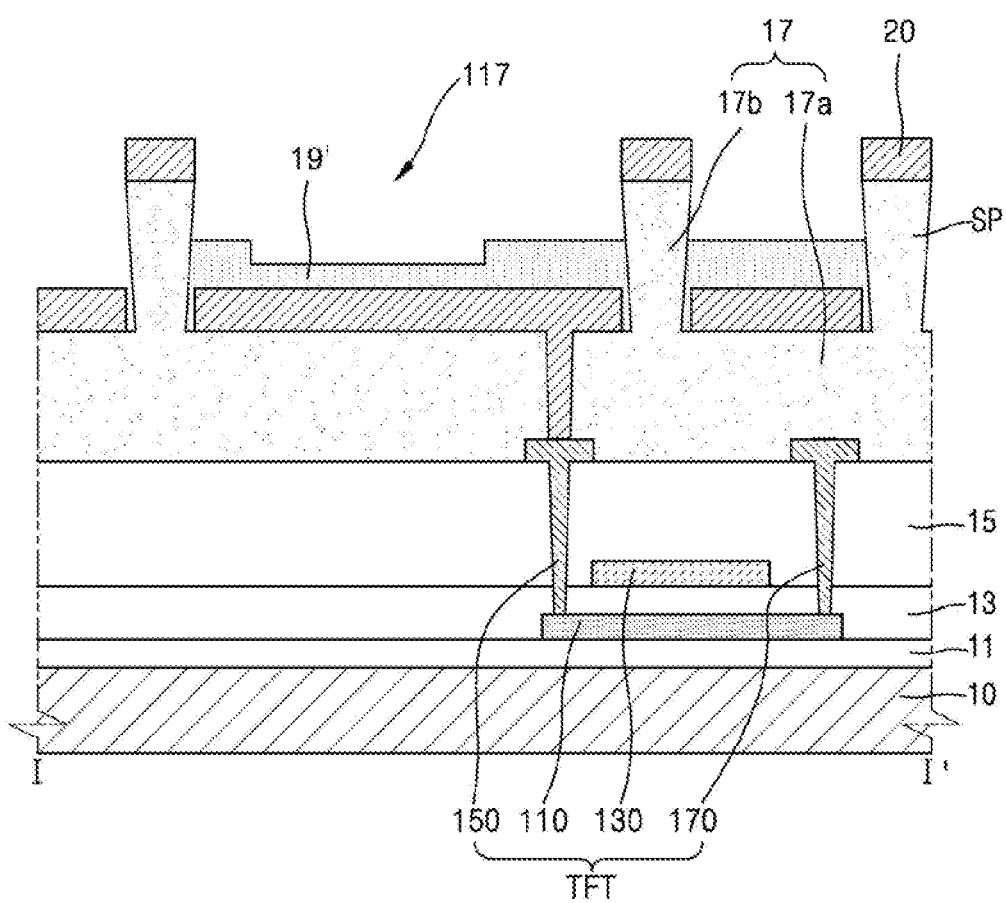

FIG. 7E schematically illustrates a second insulating layer pattern 19′ that remains after developing the second insulating layer 19″ that has been exposed to light through the half-tone mask M4.

The portion of the second insulating layer 19″ corresponding to the light-transmission portion M4c is completely removed, the portion of the second insulating layer 19″ corresponding to the semi-transmission portion M4b is partially removed, and the portion of the second insulating layer 19″ corresponding to the light shield portion M4a remains. Here, a thickness of the portion of the second insulating layer 19″ corresponding to the semi-transmission portion M4b is less than that of the second insulating layer 19″ corresponding to the light shield portion M4a, and the thickness may be adjusted by a component ratio or a thickness of the material forming the semi-transmission portion M4b.

Since the portion of the second insulating layer 19″ corresponding to the light transmission portion M4c is completely removed, the third conductive layer 20 is exposed.

Figure 7F:
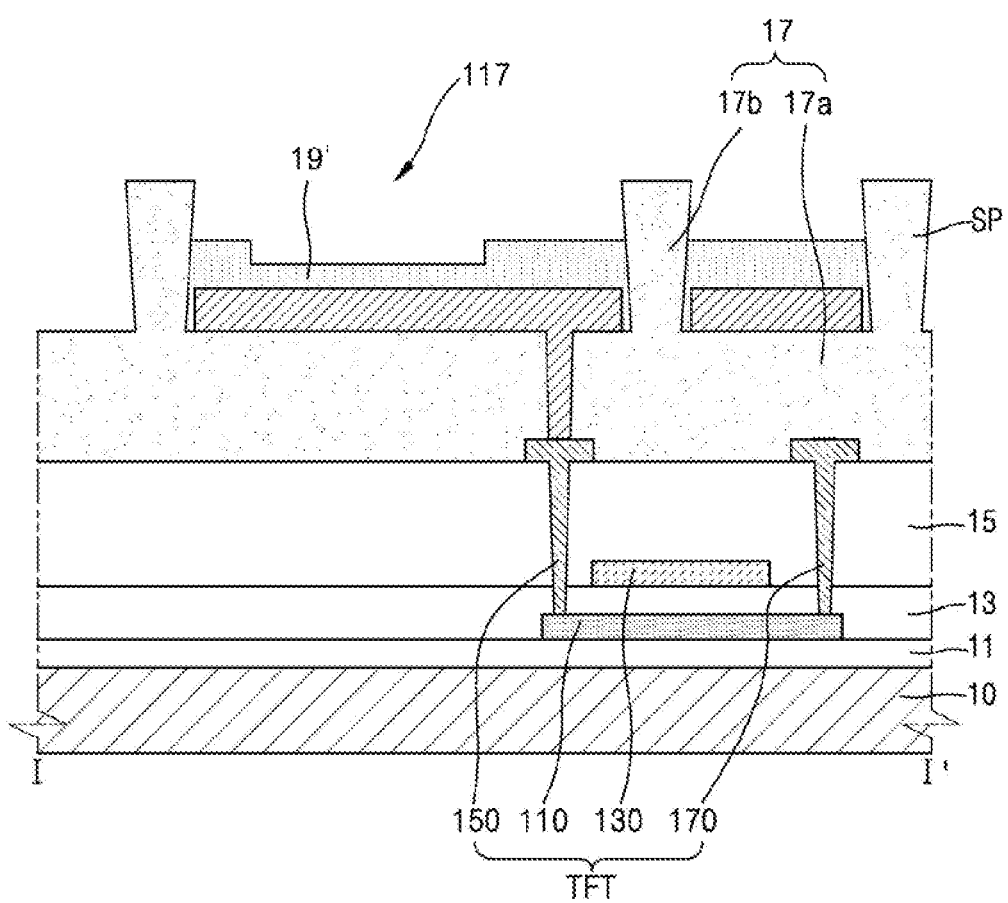

Referring to FIG. 7F, the third conductive layer 20 that is exposed may be etched and removed by using the second insulating layer pattern 19′ remaining in the process of FIG. 7E as an etch mask. Here, a partial thickness of the second insulating layer pattern 19′ may be etched. The etching may be performed by various methods, such as a wet etching and a dry etching.

Through the etching process, a part of the third conductive layer 20 remaining in the trench 117 is formed as the pixel electrode 210, and a part of the third conductive layer 20 remaining on an outer portion of the trench 117 may be formed as the wiring 260.

Figure 7G:
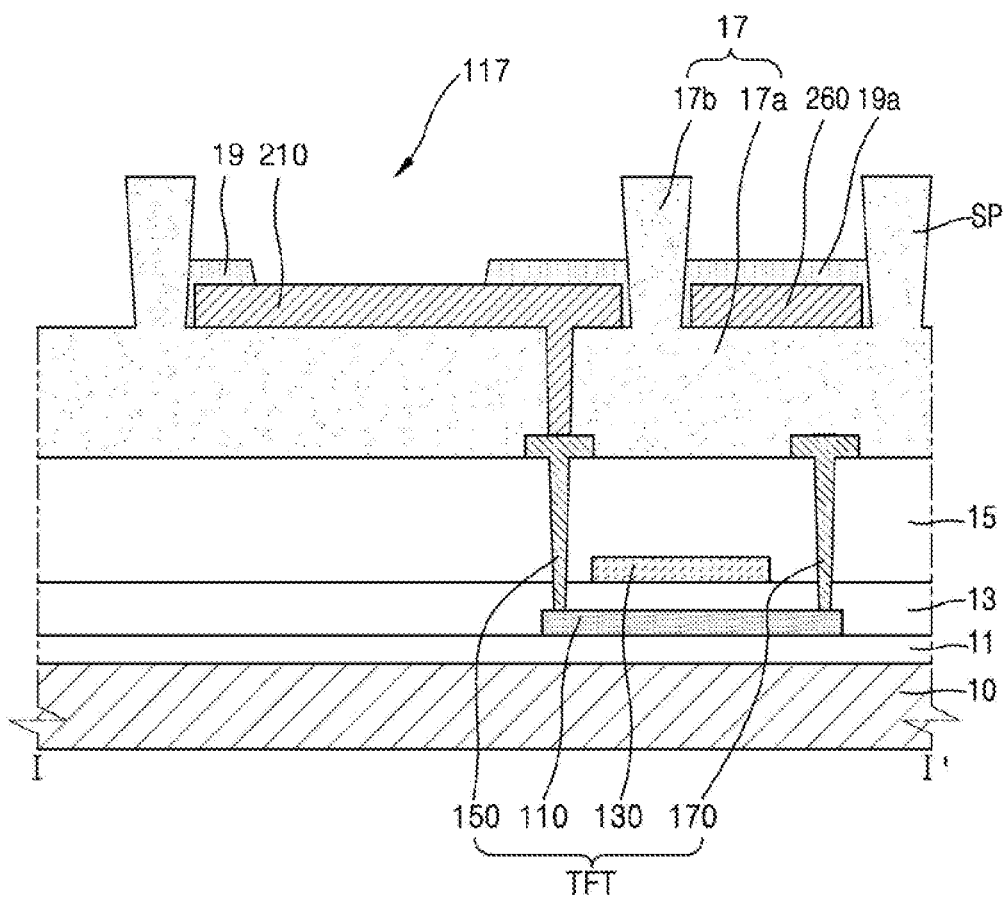

Referring to FIG. 7G, a part of the second insulating layer pattern 19′ may be removed by the ashing process. A height of the second insulating layer pattern 19′ may be reduced due to an ashing process.

The portion of the second insulating layer pattern 19′ corresponding to the semi-transmission portion M4b is completely removed by the ashing, and a part of the pixel electrode 210 may be exposed.

The portion of the second insulating layer pattern 19′ corresponding to the light shield portion M4a is lowered in height by the ashing process, thereby forming the pixel defining layer 19 covering the pixel electrode 210 partially and an insulating layer 19a that completely covers the wiring 260.

The pixel defining layer 19 covers an upper surface and a side surface of a part of the pixel electrode 210 (e.g., the second region 210b of the pixel electrode 210). The pixel defining layer 19 may completely fill the gap GAP between the pixel electrode 210 and the barrier wall 17b. The insulating layer 19a covers an upper surface and a side surface of the wiring 260. After that, the pixel defining layer 19 and the insulating layer 19a may be cured. In an exemplary embodiment, the pixel electrode 210, the wiring 260, the pixel defining layer 19, and the insulating layer 19a may be formed by one mask process using the half-tone mask M4.

Figure 7H:
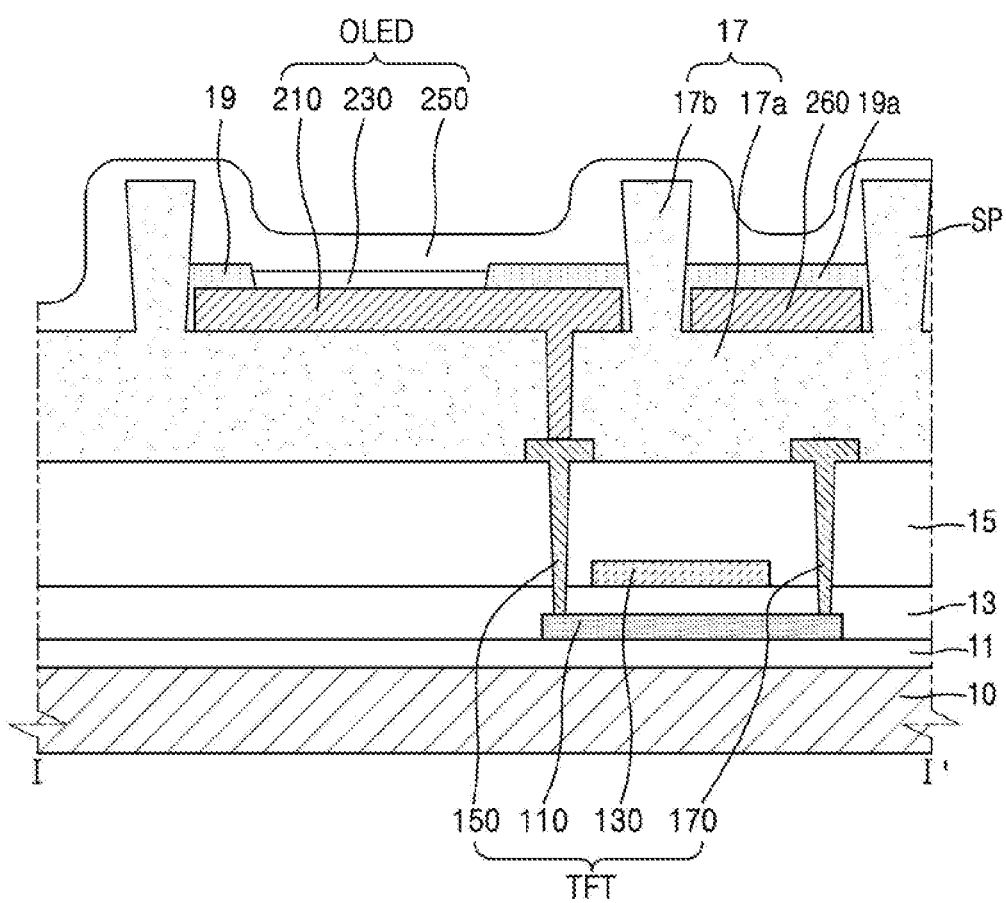

Referring to FIG. 7H, the organic emission layer 230 is formed on the exposed portion of the pixel electrode 210 that is exposed by the pixel defining layer 19, and the opposite electrode 250 is formed on the organic emission layer 230 to finish forming of an organic light-emitting diode OLED. Various functional layers may be further disposed between the pixel electrode 210 and the opposite electrode 250. The functional layers may be formed as common layers for a plurality of organic light-emitting diodes OLED of the plurality of pixels by using an open mask.

Although not shown in the drawings, a thin film encapsulation layer may be disposed on the opposite electrode 250. The thin film encapsulation layer encapsulates the organic light-emitting diode OLED and includes at least one organic layer and at least one inorganic layer.

Figure 8:
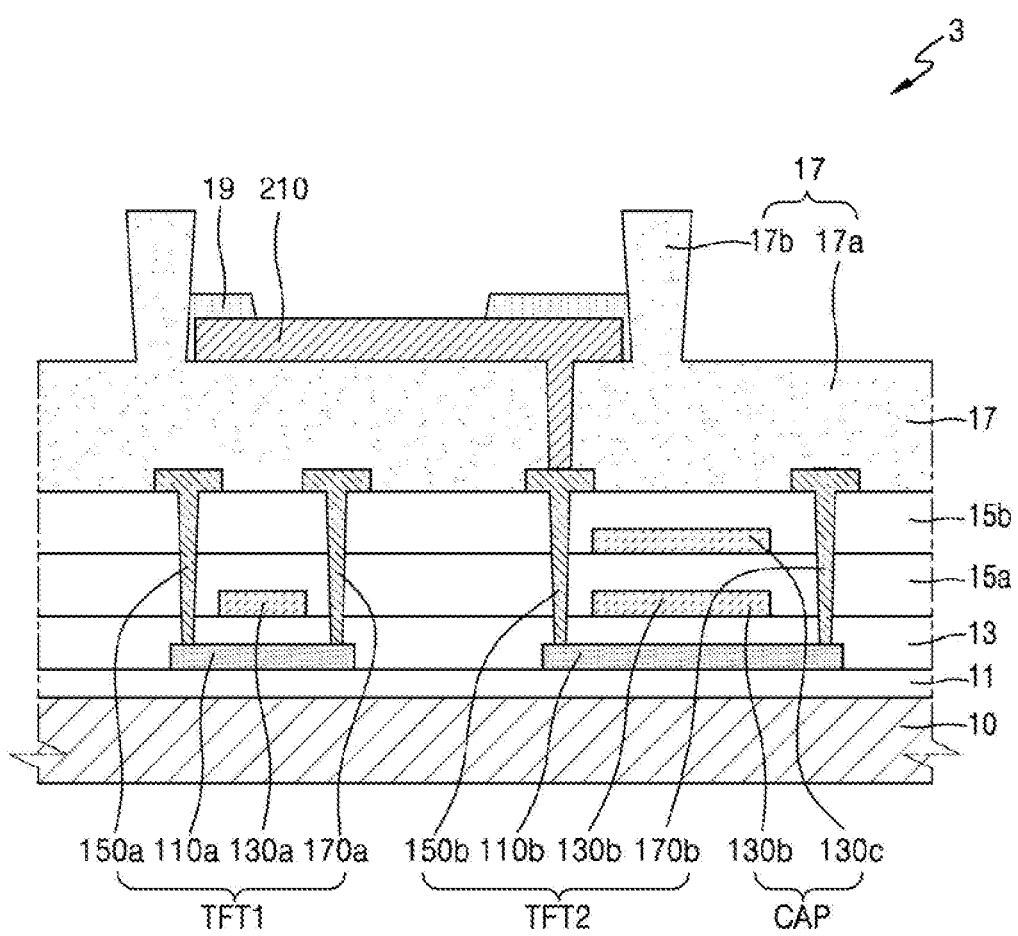
FIGS. 8 and 9 are cross-sectional views of an organic light-emitting display apparatus according to an embodiment.
Figure 9:
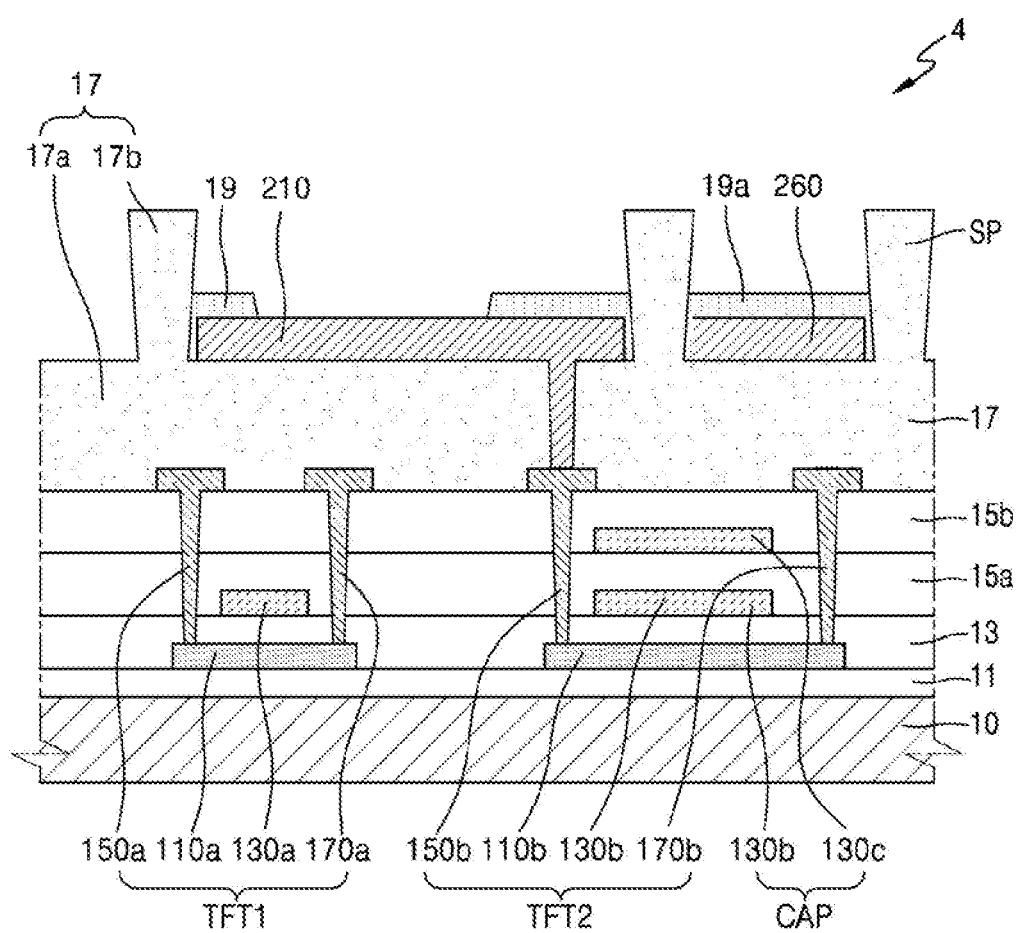

FIGS. 8 and 9 are cross-sectional views of organic light-emitting display apparatuses 3 and 4 according to exemplary embodiments.

In FIG. 8, the organic light-emitting display apparatus may include a driving circuit for driving the organic light-emitting diode that includes a first thin film transistor TFT1, a second thin film transistor TFT2, and a capacitor CAP. The other components of the organic light-emitting display apparatus 3 are the same as those of the embodiment illustrated with reference to FIG. 3.

In FIG. 9, the organic light-emitting display apparatus 4 may include a driving circuit for driving an organic light-emitting diode that includes a first thin film transistor TFT1, a second thin film transistor TFT2, and a capacitor CAP. The other elements are the same as those of the organic light-emitting display apparatus 2 of FIG. 6.

Hereinafter, the first and second thin film transistors and the capacitor will be described below.

The first thin film transistor TFT1 may include an active layer 110*a* disposed on the buffer layer 11, a gate electrode 130*a* insulated from the active layer 110*a* and disposed over at least a part of the active layer 110*a*, a source electrode 170*a*, and a drain electrode 150*a*. The gate insulating layer 13 is disposed between the active layer 110*a* and the gate electrode 130*a*, and a first interlayer insulating layer 15*a* and a second interlayer insulating layer 15*b* may be disposed between the gate electrode 130*a* and the source electrode 170*a* and the gate electrode 130*a* and the drain electrode 150*a*.

The second thin film transistor TFT2 may have a longer channel and a greater size than those of the first thin film transistor TFT1. The second thin film transistor TFT2 includes an active layer 110*b* disposed on the buffer layer 11, a gate electrode 130*b* insulated from the active layer 110*b* and disposed over at least a part of the active layer 110*b*, a source electrode 170*b*, and a drain electrode 150*b* electrically connected to the pixel electrode 210. The active layer 110*b* may have various shapes having bending portions, for example, S, M, or W shape, when viewed from the above (in a plan view). The gate insulating layer 13 is disposed between the active layer 110*b* and the gate electrode 130*b*, and the first interlayer insulating layer 15*a* and the second interlayer insulating layer 15*b* may be disposed between the gate electrode 130*b* and the source electrode 170*b* and between the gate electrode 130*b* and the drain electrode 150*b*. The source electrode 170*b* and the drain electrode 150*b* may be respectively connected to a source region and a drain region of the active layer 110*b*.

The capacitor CAP may overlap with the second thin film transistor TFT2 in a vertical direction. The capacitor CAP may use the gate electrode 130*b* of the second thin film transistor TFT2 as a lower electrode 130*b*, and may include an upper electrode 130*c* disposed above the lower electrode 130*b*. The first interlayer insulating layer 15*a* may be disposed between the lower electrode 130*b* and the upper electrode 130*c*. Since the capacitor CAP is disposed to overlap with the second thin film transistor TFT2, capacitance may be secured when the organic light-emitting display apparatus 3 continues to scale down.

As described above, the organic light-emitting display apparatuses 1 to 4 according to exemplary embodiments may reduce the number of masks for forming the via hole, the pixel electrode, and the pixel defining layer, and thus, manufacturing costs may be reduced and processes may be simplified.

Also, in the organic light-emitting display apparatuses 1 to 4 according to exemplary embodiments, the side surfaces of the pixel electrode may be completely covered by the pixel defining layer and the barrier wall of the via insulating layer.

In addition, in the organic light-emitting display apparatuses 1 to 4 according to exemplary embodiments, the spacer may be formed simultaneously with the forming of the via insulating layer, without performing an additional process for forming the spacer on the pixel defining layer or around the pixels to prevent damage on the pixel electrode during an FMM process, and thus, the number of mask processes may be reduced.

According to the organic light-emitting display apparatus and the method of manufacturing the organic light-emitting display apparatus, the number of masks may be reduced to reduce manufacturing costs and simplify manufacturing processes.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. An organic light-emitting display apparatus comprising:
    a thin film transistor disposed on a substrate and comprising a semiconductor layer, a gate electrode, a source electrode and a drain electrode;
    a first insulating layer between the semiconductor layer and the gate electrode;
    a second insulating layer between the gate electrode and the source and drain electrodes;
    a third insulating layer covering the source electrode and the drain electrode of the thin film transistor, wherein the third insulating layer is a single layer and includes a barrier wall having a first thickness from a bottom surface of the third insulating layer and a flat portion having a second thickness from the bottom surface of the third insulating layer that is less than the first thickness, and wherein the barrier wall protrudes from an upper surface of the flat portion in a direction away from the thin film transistor;
    a pixel electrode disposed on the upper surface of the flat portion of the third insulating layer, wherein the pixel electrode is electrically connected to the thin film transistor; and
    a pixel defining layer disposed on an edge of the pixel electrode, and within a gap between the barrier wall and the pixel electrode,
    wherein the gap between the barrier wall and the pixel electrode exposes the upper surface of the flat portion of the third insulating layer, and
    wherein the barrier wall is spaced apart from the pixel electrode and surrounds the pixel electrode along the edge of the pixel electrode.

2. The organic light-emitting display apparatus of claim 1, wherein an angle between an internal side surface of the barrier wall and the upper surface of the flat portion is 90° or greater.

3. The organic light-emitting display apparatus of claim 1, wherein the third insulating layer comprises a negative photosensitive insulating material.

4. The organic light-emitting display apparatus of claim 1, further comprising:

a wiring on the flat portion between at least two barrier walls of the third insulating layer, wherein the wiring and the pixel electrode are formed of substantially the same material; and a fourth insulating layer completely covering the wiring, wherein the fourth insulating layer and the pixel defining layer are formed of substantially the same material.

5. The organic light-emitting display apparatus of claim 1, wherein the barrier wall has a thickness that is greater than a thickness of the pixel defining layer.

6. The organic light-emitting display apparatus of claim 1, wherein the third insulating layer further comprises:

a spacer protruding from the flat portion in a direction away from the thin film transistor, wherein the spacer is spaced apart from the barrier wall.

7. The organic light-emitting display apparatus of claim 6, wherein the barrier wall and the spacer have substantially the same thickness.

8. The organic light-emitting display apparatus of claim 1, wherein the pixel electrode covers a via hole penetrating the flat portion of the third insulating layer and is electrically connected to the thin film transistor through the via hole.

9. The organic light-emitting display apparatus of claim 1, further comprising:

a capacitor overlapping with the thin film transistor in a vertical direction to a surface of the substrate and including a first electrode and a second electrode, wherein the gate electrode of the thin film transistor serves as the first electrode, and wherein the second electrode overlaps the first electrode.

10. The organic light-emitting display apparatus of claim 1, further comprising:

an opposite electrode facing the pixel electrode; and an organic emission layer between the pixel electrode and the opposite electrode.

11. The organic light-emitting display apparatus of claim 1, wherein the barrier wall has a shape of an isosceles trapezoid and wherein the isosceles trapezoid shape of the barrier wall partially overlaps the pixel defining layer in a direction perpendicular to a planar surface of the substrate.

12. The organic light-emitting display apparatus of claim 11, wherein the pixel defining layer completely fill the gap between the pixel electrode and the barrier wall.

13. The organic light-emitting display apparatus of claim 1, wherein the first thickness of the barrier wall is greater than a thickness of the pixel electrode.

14. The organic light-emitting display apparatus of claim 1, wherein the flat portion of the third insulating layer comprises a first flat portion within the barrier wall and a second flat portion outside the barrier wall, and the pixel electrode is disposed on the first flat portion of the third insulating layer.

15. The organic light-emitting display apparatus of claim 14, further comprising:

a wiring interposed between the barrier wall and g spacer and on the second flat portion of the third insulating layer.

16. A method of manufacturing an organic light-emitting display apparatus, the method comprising:

forming a thin film transistor comprising a semiconductor layer, a gate electrode, a source electrode and a drain electrode on a substrate;

forming a first insulating layer on the source electrode and the drain electrode of the thin film transistor, wherein the first insulating layer is a single layer, wherein the first insulating layer covers the thin film transistor and comprises a flat portion and a barrier wall protruding from an upper surface of the flat portion in a direction away from the thin film transistor;

forming a pixel electrode on the upper surface of the flat portion of the first insulating layer, wherein the pixel electrode is electrically connected to the thin film transistor; and forming a pixel defining layer on the pixel electrode, wherein the pixel defining layer partially exposes the pixel electrode, wherein the pixel defining layer is disposed within a gap between the barrier wall and the pixel electrode and on an edge of the pixel electrode, wherein the gap between the barrier wall and the pixel electrode exposes the upper surface of the flat portion of the first insulating layer, and wherein the barrier wall is spaced apart from the pixel electrode and surrounds the pixel electrode along the edge of the pixel electrode.

17. The method of claim 16, further comprising:

wherein the forming of the first insulating layer comprises:

forming an insulating layer covering the source electrode and the drain electrode of the thin film transistor; and partially removing the insulating layer to form the barrier wall and a via hole penetrating the flat portion of the first insulating layer and exposing a part of an electrode of the thin film transistor.

18. The method of claim 17, further comprising:

forming a spacer by partially removing the insulating layer, wherein the spacer and the barrier wall are formed simultaneously, wherein the first insulating layer further comprises the spacer.

19. The method of claim 16, wherein the forming of the pixel electrode and the pixel defining layer comprises:

forming a conductive layer on the first insulating layer;

forming a second insulating layer on the conductive layer;

partially removing the second insulating layer to expose a part of the conductive layer;

etching the exposed part of the conductive layer to form the pixel electrode; and partially removing the second insulating layer remaining on the flat portion of the first insulating layer surrounded by the barrier wall to form the pixel defining layer that exposes a part of the pixel electrode.

20. The method of claim 19, further comprising:

forming a wiring on the flat region of the first insulating layer which is between at least two barrier walls, wherein the wiring and the pixel electrode are formed simultaneously; and forming an insulating layer that completely covers the wiring, wherein the insulating layer and the pixel defining layer are simultaneously formed.

* * * * *